(12) United States Patent
Li et al.

(10) Patent No.: US 12,069,852 B2
(45) Date of Patent: *Aug. 20, 2024

(54) METHODS OF FORMING INTEGRATED ASSEMBLIES HAVING CONDUCTIVE MATERIAL ALONG SIDEWALL SURFACES OF SEMICONDUCTOR PILLARS

(71) Applicant: Micron Technology, Inc., Boise, ID (US)

(72) Inventors: Hong Li, Boise, ID (US); Ramaswamy Ishwar Venkatanarayanan, Garden City, ID (US); Sanh D. Tang, Kuna, ID (US); Erica L. Poelstra, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/862,659

(22) Filed: Jul. 12, 2022

(65) Prior Publication Data
US 2022/0344350 A1 Oct. 27, 2022

Related U.S. Application Data

(63) Continuation of application No. 17/070,759, filed on Oct. 14, 2020, now Pat. No. 11,444,088, which is a
(Continued)

(51) Int. Cl.
*H10B 12/00* (2023.01)
*G11C 11/402* (2006.01)
(Continued)

(52) U.S. Cl.
CPC ........ *H10B 12/488* (2023.02); *G11C 11/4023* (2013.01); *H01L 23/49* (2013.01);
(Continued)

(58) Field of Classification Search
CPC . H10B 12/31; H10B 12/053; H01L 29/66666; H01L 29/7827
See application file for complete search history.

(56) References Cited

U.S. PATENT DOCUMENTS 7,371,627 B1 5/2008 Forbes
9,508,847 B2 * 11/2016 Oh ......................... H10B 63/30
(Continued)

*Primary Examiner* — Bilkis Jahan
*Assistant Examiner* — Victor V Barzykin
(74) *Attorney, Agent, or Firm* — Wells St. John P.S.

(57) ABSTRACT

Some embodiments include a method of forming an integrated assembly. A structure is provided to have conductive lines, and to have rails over the conductive lines and extending in a direction which crosses the conductive lines. Each of the rails includes pillars of semiconductor material. The rails have sidewall surfaces along spaces between the rails. The pillars have upper segments, middle segments and lower segments. First-material liners are formed along the sidewall surfaces of the rails. A second material is formed over the liners. First sections of the liners are removed to form gaps between the second material and the sidewall surfaces of the rails. Second sections of the liners remain under the gaps. Conductive material is formed within the gaps. The conductive material is configured as conductive lines which are along the middle segments of the pillars.

28 Claims, 34 Drawing Sheets

Related U.S. Application Data continuation of application No. 16/150,412, filed on Oct. 3, 2018, now Pat. No. 10,818,673.

(51) Int. Cl.
*H01L 23/49* (2006.01)
*H01L 23/538* (2006.01)
*H01L 29/66* (2006.01)
*H01L 29/78* (2006.01)

(52) U.S. Cl.
CPC ...... *H01L 23/538* (2013.01); *H01L 29/66666* (2013.01); *H01L 29/7827* (2013.01); *H10B 12/053* (2023.02); *H10B 12/30* (2023.02); *H10B 12/31* (2023.02); *H10B 12/315* (2023.02); *H10B 12/34* (2023.02)

(56) References Cited

U.S. PATENT DOCUMENTS

| | | |
|---|---|---|
| 9,837,420 B1 | 12/2017 | Ramaswamy |
| 10,461,185 B2 | 10/2019 | Tang et al. |
| 10,573,753 B1 * | 2/2020 | Zang ................. H01L 21/76832 |
| 10,615,165 B1 | 4/2020 | Nourbakhsh et al. |
| 10,818,673 B2 | 10/2020 | Li |
| 2012/0086074 A1 | 4/2012 | Hwang et al. |
| 2013/0237044 A1 * | 9/2013 | Chen ............... H01L 21/823437 438/587 |
| 2014/0001527 A1 * | 1/2014 | Myung ................. H10B 12/34 257/296 |
| 2014/0011334 A1 | 1/2014 | Cho et al. |
| 2014/0061778 A1 | 3/2014 | Myung et al. |
| 2014/0061850 A1 | 3/2014 | Cho et al. |
| 2015/0056801 A1 * | 2/2015 | Park ..................... H01L 21/7682 438/655 |
| 2016/0172488 A1 * | 6/2016 | Oh ....................... H10B 12/315 257/330 |
| 2016/0307999 A1 * | 10/2016 | Kim ..................... H01L 21/764 |
| 2020/0058565 A1 * | 2/2020 | Cheng ................ H01L 29/0653 |

* cited by examiner

METHODS OF FORMING INTEGRATED ASSEMBLIES HAVING CONDUCTIVE MATERIAL ALONG SIDEWALL SURFACES OF SEMICONDUCTOR PILLARS

RELATED PATENT DATA

This application is a continuation of and claims priority to U.S. patent application Ser. No. 17/070,759, filed Oct. 14, 2020, which is a continuation application of U.S. patent application Ser. No. 16/150,412, filed Oct. 3, 2018, now U.S. Pat. No. 10,818,673, the disclosures of which are incorporated herein by reference.

TECHNICAL FIELD

Methods of forming integrated assemblies having conductive material along sidewall surfaces of semiconductor pillars.

BACKGROUND

Integrated circuitry may include vertically-extending pillars of semiconductor material. Such pillars may be arranged in an array. The array may be considered to comprise rows and columns; with the columns crossing the rows.

The pillars may be incorporated into transistors. The transistors may comprise conductive gates along the pillars. Conductive wordlines may extend along the rows of the array, and may be electrically coupled with the conductive gates of the transistors. In some applications, the transistors may be coupled with charge-storage devices (e.g., capacitors), and thereby incorporated into memory cells of dynamic random-access memory (DRAM).

Transistors may be utilized in other memory besides DRAM, and may be utilized in other applications alternative to, or in addition to, memory; such as sensors, logic, etc.

A continuing goal of integrated circuit fabrication is to increase integration density, and an associated goal is to scale devices to increasingly smaller dimensions. It would be desirable to develop improved methods for fabricating transistors, and to develop new architectures comprising such transistors.

BRIEF DESCRIPTION OF THE DRAWINGS

FIG. 2 is a diagrammatic top view. FIG. 3 is diagrammatic cross-sectional side view along the lines 3-3 of FIGS. 2 and 4. FIG. 4 is diagrammatic cross-sectional side view along the lines 4-4 of FIGS. 2 and 3.

FIG. 5 is a diagrammatic top view. FIG. 6 is a diagrammatic cross-sectional side view along the lines 6-6 of FIGS. 5 and 7. FIG. 7 is a diagrammatic cross-sectional side view along the lines 7-7 of FIGS. 5 and 6.

DETAILED DESCRIPTION OF THE ILLUSTRATED EMBODIMENTS

Some embodiments include methods in which first-material liners are formed to be between semiconductor-material pillars and additional material. Upper sections of the liners are removed to leave gaps over remaining lower sections of the liners. Conductive material is formed within the gaps and is patterned into wordlines. The additional material may or may not be subsequently removed, and the lower sections of the liners may or may not be subsequently removed. Example embodiments are described with reference to FIGS. 1-34.

Figure 1:
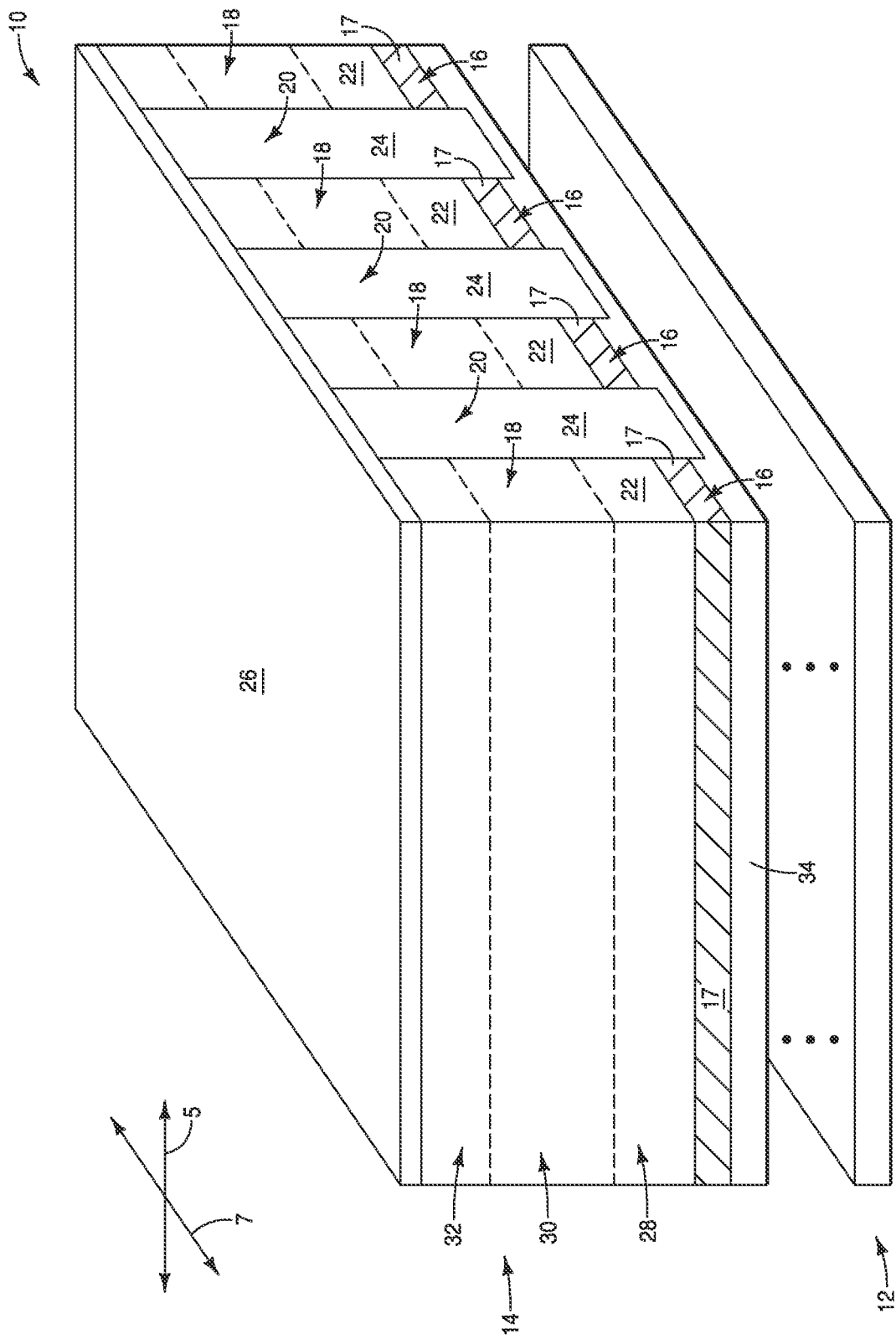
FIG. 1 is a diagrammatic three-dimensional view of an example assembly at an example process stage.

Referring to FIG. 1, an assembly (i.e., construction) 10 comprises a structure 14 supported by a base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. A gap is provided between the substrate 12 and the structure 14 to indicate that there may be other materials, circuitry, etc., between the base 12 and the structure 14. For instance, insulative material may be provided between the structure 14 and the base 12.

The structure 14 comprises a plurality of conductive lines 16 which extend along a first direction, with the first direction being diagrammatically indicated with an axis 5. In some embodiments, the conductive lines 16 may be incorporated into digit lines.

The conductive lines 16 comprise conductive material 17. Such conductive material may comprise any suitable electrically conductive composition(s); and in some embodiments may, for example, include one or more of various metals (e.g., titanium, tungsten, cobalt, nickel, ruthenium, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

First panels 18 are directly over the conductive lines 16, and extend along the first direction of axis 5. Second panels 20 are adjacent to the first panels 18. The first and second panels 18 and 20 alternate with one another along a second direction, with the second direction being diagrammatically illustrated with an axis 7. The second direction represented by the axis 7 crosses the first direction represented by the axis 5. In some embodiments, the second direction represented by the axis 7 may be substantially orthogonal to the first direction represented by the axis 5, with the term "substantially orthogonal" meaning orthogonal to within reasonable tolerances of fabrication and measurement.

The first panels 18 comprise semiconductor material 22, and the second panels 20 comprise insulative material 24.

The semiconductor material 22 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 22 may comprise, consist essentially of, or consist of silicon. The silicon may comprise any suitable crystallographic configuration; and in some embodiments may be monocrystalline silicon, polycrystalline silicon, etc.

The insulative material 24 may comprise any suitable composition(s); and in some embodiments may comprise, consist essentially of, or consist of silicon dioxide.

The panels 18 and 20 may be representative of a large number of panels formed across the structure 14 during fabrication of integrated circuitry. For instance, the panels may be representative of a large number of panels utilized during the fabrication of integrated memory (e.g., DRAM).

Protective material 26 is formed over the structure 14, and specifically is formed over the first and second panels 18 and 20. The protective material 26 may comprise any suitable composition(s); and in some embodiments may comprise, consist essentially of, or consist of silicon nitride. The protective material 26 may comprise any suitable thickness, and in some embodiments may comprise a thickness within a range of from about 200 angstroms (Å) to about 500 Å. The protective material 26 may correspond to an optional hardmask.

The semiconductor material 22 of the first panels 18 is subdivided amongst three portions (i.e., segments) 28, 30 and 32. Dashed lines are provided to diagrammatically indicate approximate boundaries between the three portions. The top and bottom portions 28 and 32 may be appropriately doped to be incorporated into source/drain regions of vertical transistors (e.g., may be doped to a concentration of at least about $10^{21}$ atoms/cm$^3$ with conductivity-enhancing dopant), and the middle portion 30 may be appropriately doped to be incorporated into channel regions of the vertical transistors (and in some embodiments may be undoped, or intrinsically doped). The portions 28, 30 and 32 may be doped within the shown assembly 10 of FIG. 1; or at least one of the portions 28, 30 and 32 may doped at a subsequent process stage.

An insulative material 34 is under the panels 18 and 20. The insulative material 34 may comprise any suitable composition(s), and in some embodiments may comprise, consist essentially of, or consist of silicon dioxide. The insulative material 34 may comprise a same composition as the insulative panels 20 in some embodiments, and may comprise a different composition relative to the insulative panels 20 in other embodiments.

The assembly 10 of FIG. 1 may be fabricated with any suitable processing. Persons ordinary skill in the art will recognize suitable methods for fabricating such assembly.

Figure 2:
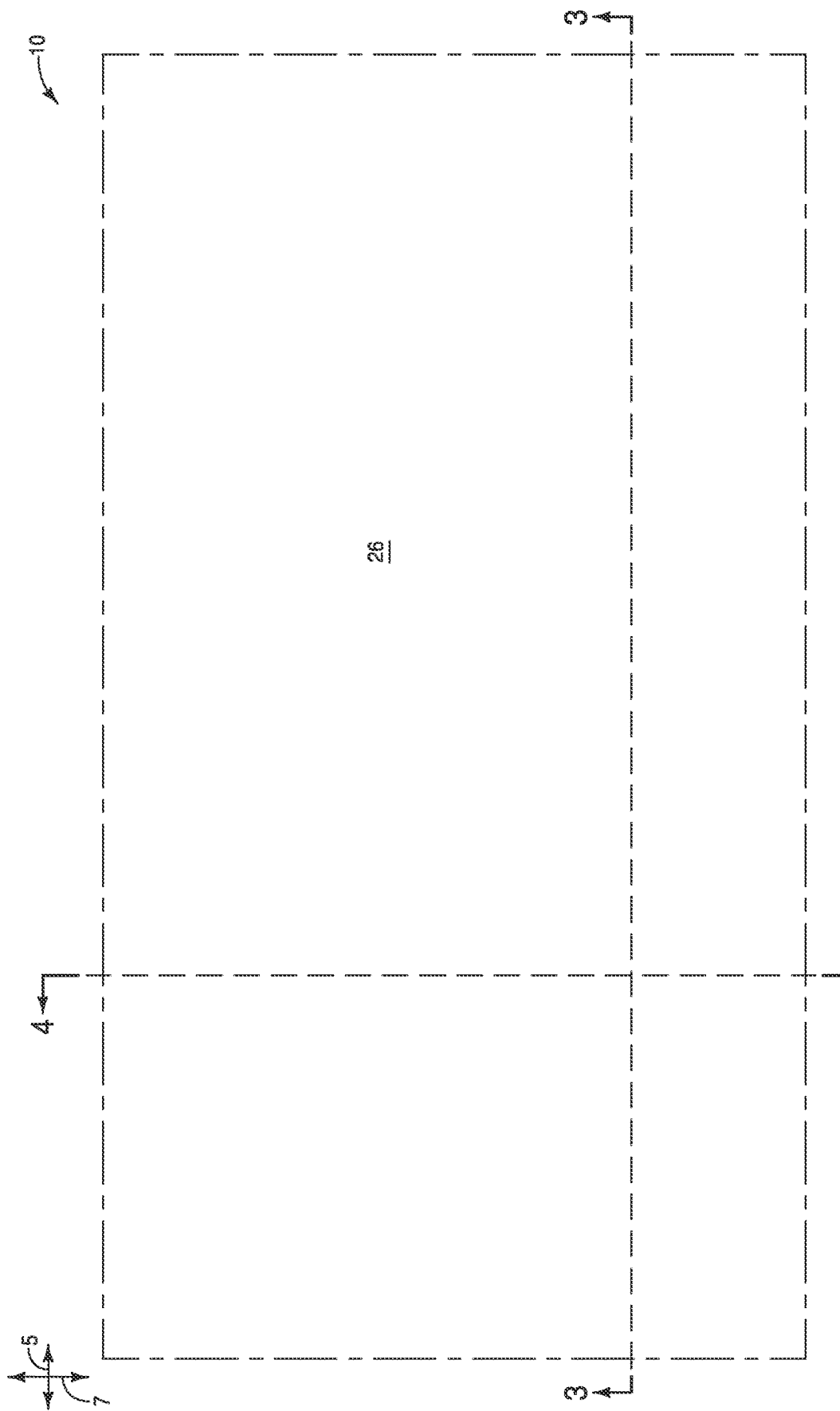
FIGS. 2-4 are two-dimensional views of the assembly of FIG. 1.
Figure 3:
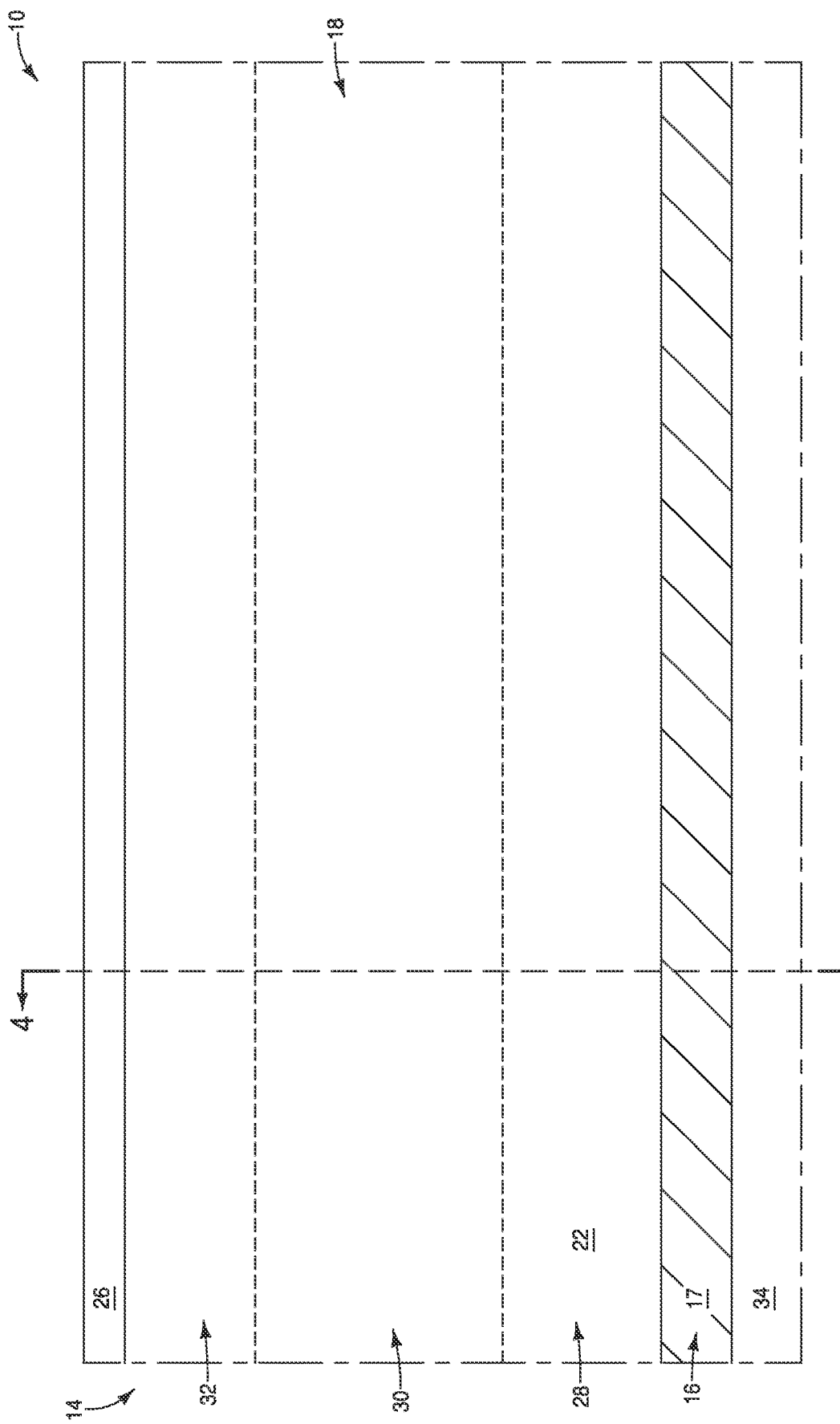
Figure 4:
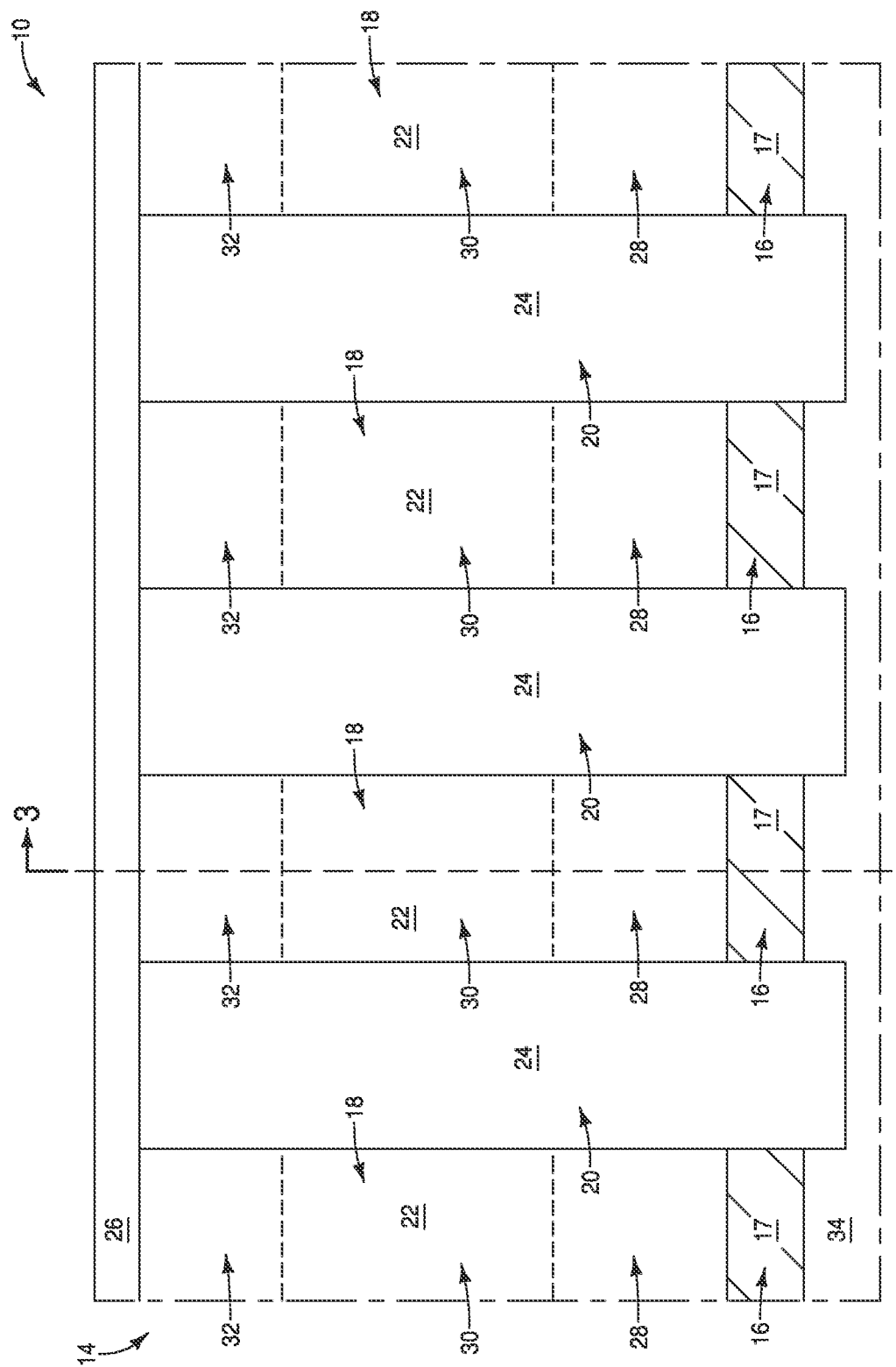

The three-dimensional view of FIG. 1 is helpful for explaining the relationship between the panels 18 and 20, and the relationship between the structure 14 and the underlying base 12. However, methodology of the present invention may be easier to describe using two-dimensional views rather than with three-dimensional views. Accordingly, FIGS. 2-4 are provided to illustrate construction 10 with two-dimensional views. FIG. 2 shows a top view of construction 10, and FIGS. 3 and 4 show cross-sectional side views along the lines 3-3 and 4-4 of FIG. 2, respectively. The underlying base 12 is not shown in FIGS. 2-4 (or in any of the other two-dimensional views which follow) in order to simplify the drawings, but it is to be understood that the appropriate base may be provided to support the illustrated structures.

Figure 5:
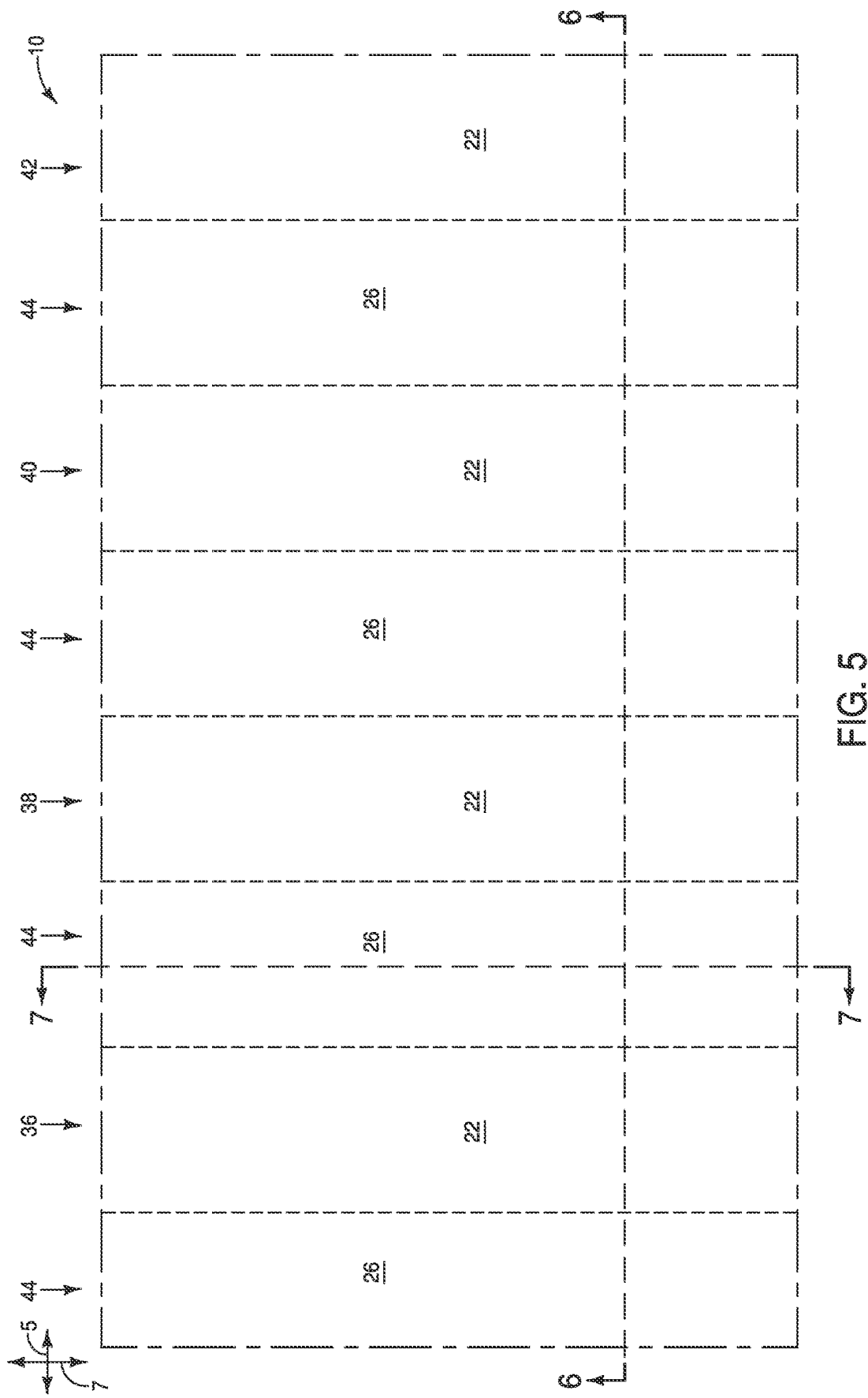
FIGS. 5-7 are views of the assembly of FIGS. 2-4 at an example processing stage subsequent to that of FIGS. 2-4.
Figure 6:
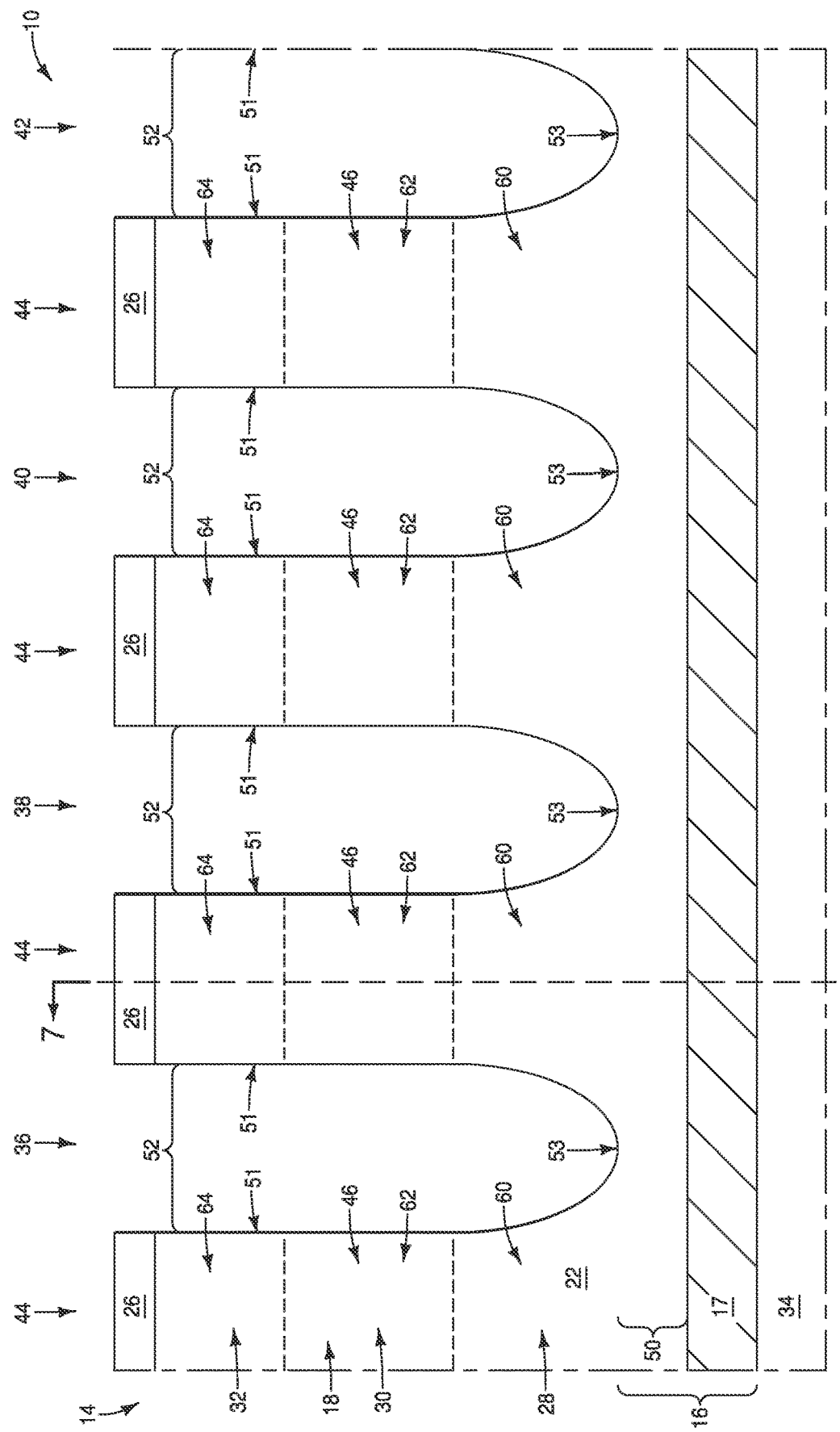
Figure 7:
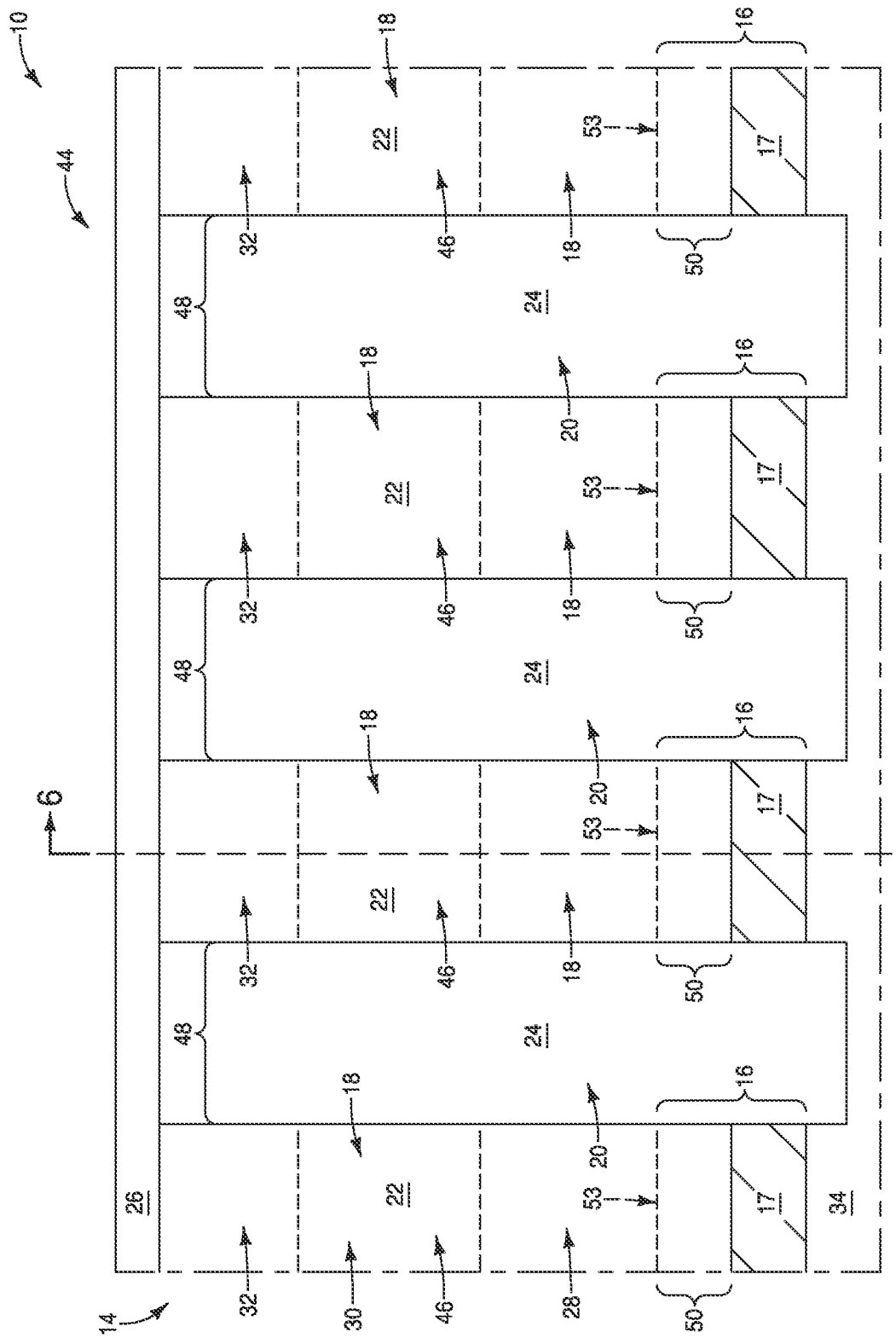

Referring to FIGS. 5-7, trenches 36, 38, 40 and 42 are formed to extend through the protective material 26 and into the structure 14. The trenches may be formed with any suitable processing. For instance, a patterned mask (not shown) may be utilized to define locations of the trenches, and then the trenches may be formed with one or more suitable etches. The mask may be subsequently removed to leave the construction of FIGS. 5-7. The trenches may all have about the same widths as one another (as shown), or at least one of the trenches may have a substantially different width relative to at least one other of the trenches (as described below with reference to FIGS. 17-21). The trenches may be formed with any suitable processing. For instance, a patterned mask (not shown) may be utilized to define locations of the trenches, and then the trenches may be formed with one or more suitable etches. The mask may be subsequently removed to leave the construction of FIGS. 5-7.

The trenches 36, 38, 40 and 42 may be representative of a large number of trenches formed across a structure during fabrication of integrated circuitry. For instance, the trenches may be representative of a large number of trenches utilized during the fabrication of integrated memory.

The trenches 36, 38, 40 and 42 extend along the second direction of axis 7. Upper portions of the structure 14, together with the protective material 26 over such upper portions, are patterned into rails 44; with such rails extending along the second direction of axis 7. The cross-section of FIG. 7 is along one of the rails 44. The semiconductor material 22 within the rails is configured as vertically-extending pillars 46. The pillars 46 within each of the rails 44 are spaced from one another by insulative regions 48 comprising the insulative material 24 (as shown in FIG. 7).

The trenches 36, 38, 40 and 42 have interior surfaces which include sidewall surfaces 51 of the rails 44, and which include bottom surfaces 53.

Lower portions of the semiconductor material 22 remains under the rails 42 and the trenches 36, 38, 40 and 42, with such lower portions being configured as lines 50 passing under the trenches and the vertically-extending pillars 46. The lines 50 have upper surfaces coextensive with the bottom surfaces 53 of the trenches 36, 38, 40 and 42; and approximate locations of such surfaces 53 are diagrammatically illustrated in FIG. 7 to assist the reader in visualizing the lines 50 extending in and out of the page relative to the cross-sectional view of FIG. 7. The lines 50 are conductively doped, and in some embodiments may be considered to be additional portions of the digit lines 16.

The rails 44 may be considered to be laterally spaced from one another by intervening spaces 52, with such spaces corresponding to the trenches 36, 38, 40 and 42.

In the illustrated embodiment, each of the pillars 46 comprises a lower segment 60 comprising the source/drain region 28, an upper segment 64 comprising the source/drain region 32, and a middle segment 62 comprising the channel region 30. The segments 60, 62 and 64 may or may not be doped at the processing stage of FIGS. 5-7. In the shown embodiment, the segments 60, 62 and 64 are appropriately doped to include the source/drain regions 28 and 32, and the channel region 30. The lower source/drain regions 28 are electrically coupled with the digit lines 16.

The processing steps described above are shown with multiple views (specifically, a first step is shown with the views of FIGS. 1-4, and a second step is shown with the views of FIGS. 5-7). The multiple views are provided to assist the reader in understanding three-dimensional relationships within the assemblies described above. The remaining process stages will be described with only single views (specifically, views along the same cross-section shown in FIGS. 3 and 6), as such single views will be sufficient for conveying relevant components of the invention(s) described herein.

Figure 8:
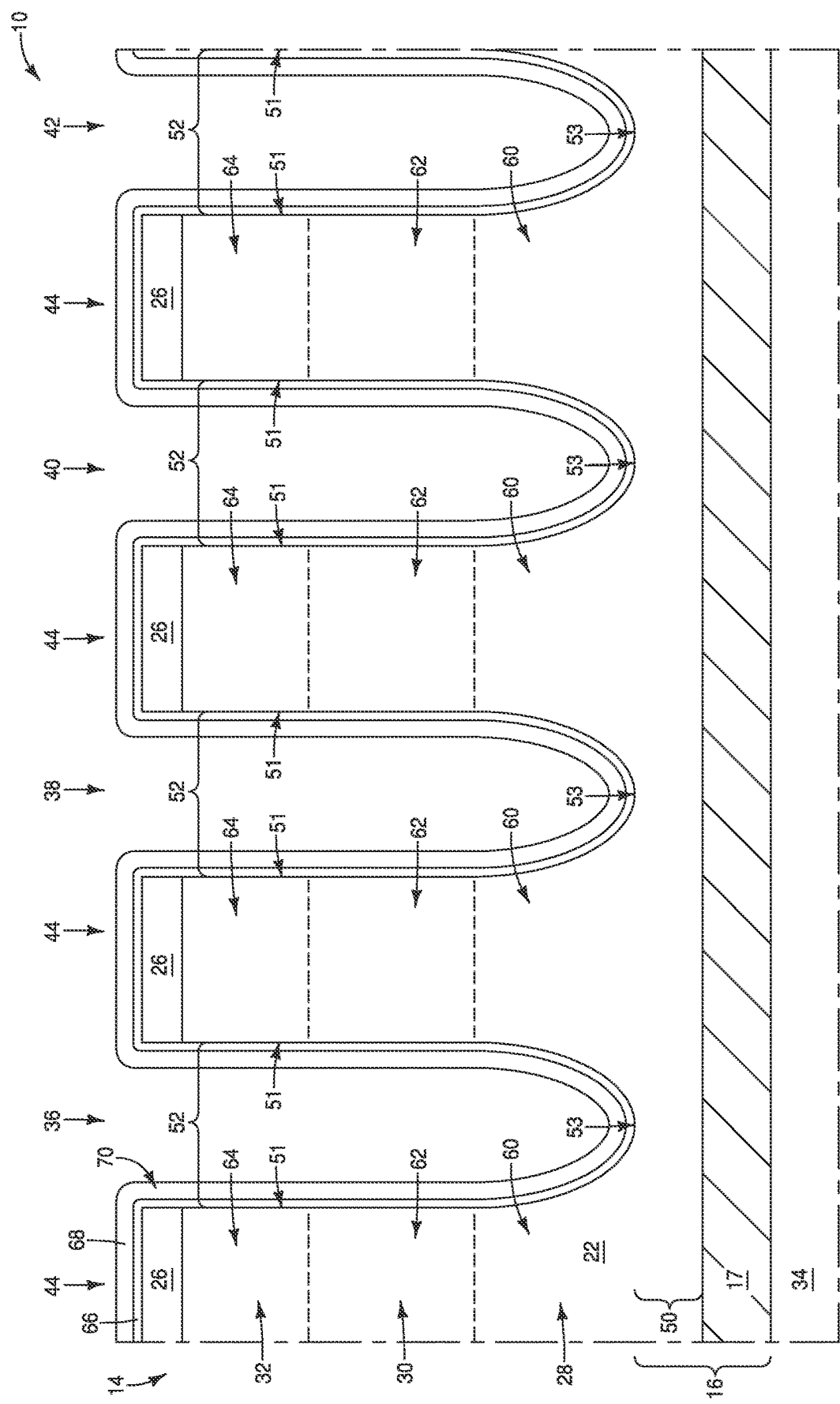
FIGS. 8-15 are diagrammatic cross-sectional side views along the same cross-section as FIG. 6 at example processing stages following that of FIG. 6.

Referring to FIG. 8, construction 10 is shown at a processing stage following that of FIG. 6. A dielectric material 66 is formed to extend over the rails 44 and along the interior surfaces of the trenches 36, 38, 40 and 42. The dielectric material 66 may correspond to gate dielectric material. In some embodiments, the dielectric material 66 may comprise high-k dielectric material (with the term high-k meaning a dielectric constant greater than that of silicon dioxide), low-k dielectric material (with the term low-k meaning a dielectric constant less than that of silicon oxide) and/or may comprise silicon dioxide. In some embodiments the dielectric material 66 may comprise, consist essentially of, or consist of one or more of aluminum oxide, hafnium oxide, zirconium oxide, silicon dioxide, etc. The dielectric material 66 may be formed to any suitable thickness; such as, for example, a thickness within a range of from about 10 Å to about 100 Å.

A first material 68 is formed over the dielectric material 66; and is formed to extend over the rails 44 and along the interior surfaces of the trenches 36, 38, 40 and 42. The first material 68 may be considered to be configured as a liner 70. The first material 68 may be formed to any suitable thickness; such as, for example, a thickness within a range of from about 30 Å to about 50 nanometers (nm).

The first material 68 may comprise any suitable composition(s). In some embodiments, the first material 68 is entirely sacrificial, and may thus comprise any composition having desired etch properties (with such etch properties being described with respect to processing which follows). In other embodiments, at least some of the first material will remain in a final construction as an insulative material. In some example embodiments, the material 68 is an insulative material which may comprise, consist essentially of, or consist of silicon nitride. In some example embodiments, the material 68 is a sacrificial material which may comprise, consist essentially of, or consist of silicon (e.g., polycrystalline silicon), which may or may not be conductively-doped. To the extent that the silicon is conductively-doped, such doping may be utilized to provide desired etch properties to the silicon rather than for conductive properties.

Figure 9:
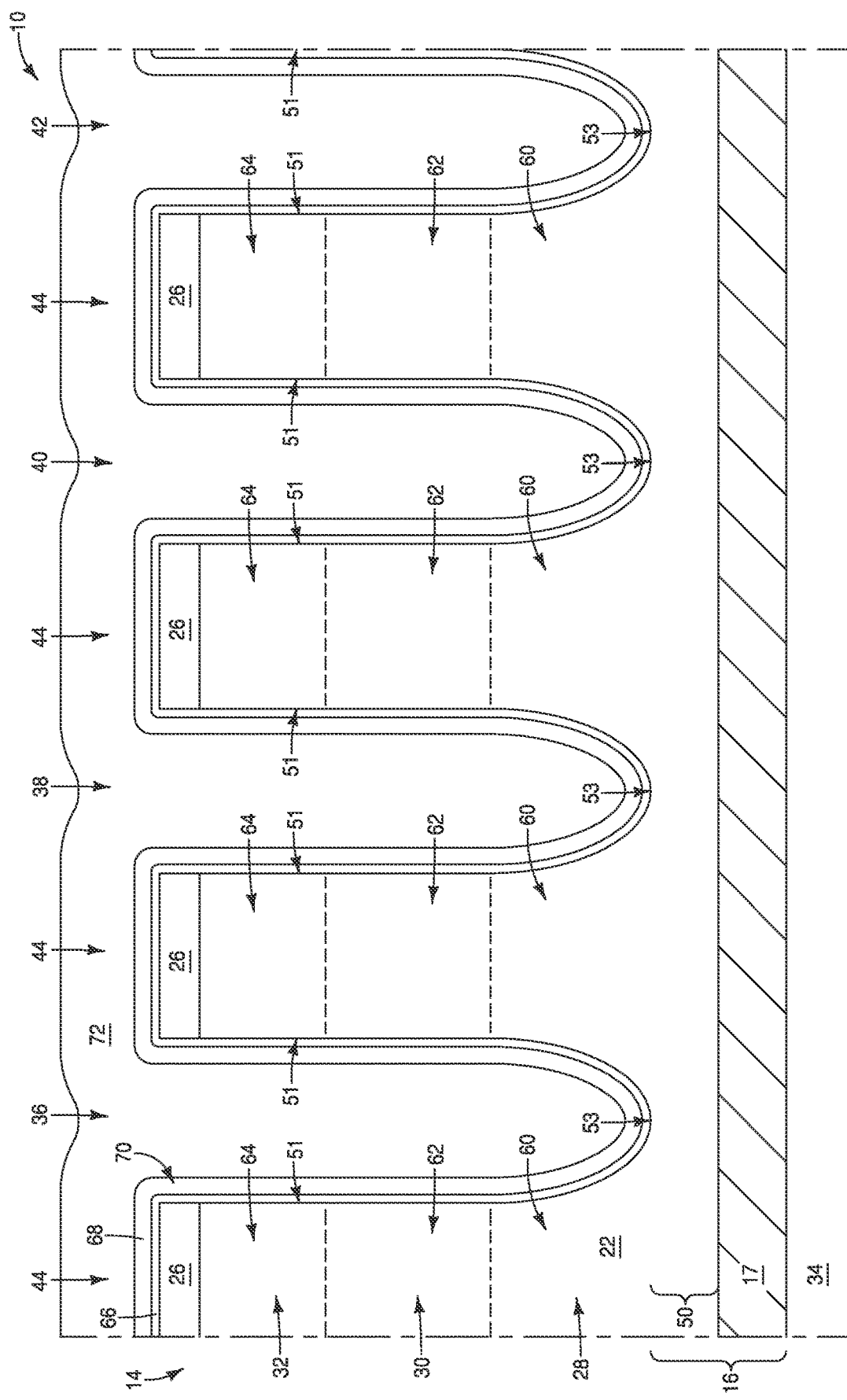

Referring to FIG. 9, a second material 72 is formed over the liner 70 (i.e., over the first material 68). The second material 72 may comprise any suitable composition(s). In some embodiments, the second material 72 is entirely sacrificial, and may thus comprise any composition having desired etch properties (with such etch properties being described with respect to processing which follows). In other embodiments, at least some of the second material 72 will remain in a final construction as an insulative material. In some example embodiments, the material 72 is an insulative material which may comprise, consist essentially of, or consist of silicon dioxide.

The second material 72 extends over the rails 44 and within the trenches 36, 38, 40 and 42.

Figure 10:
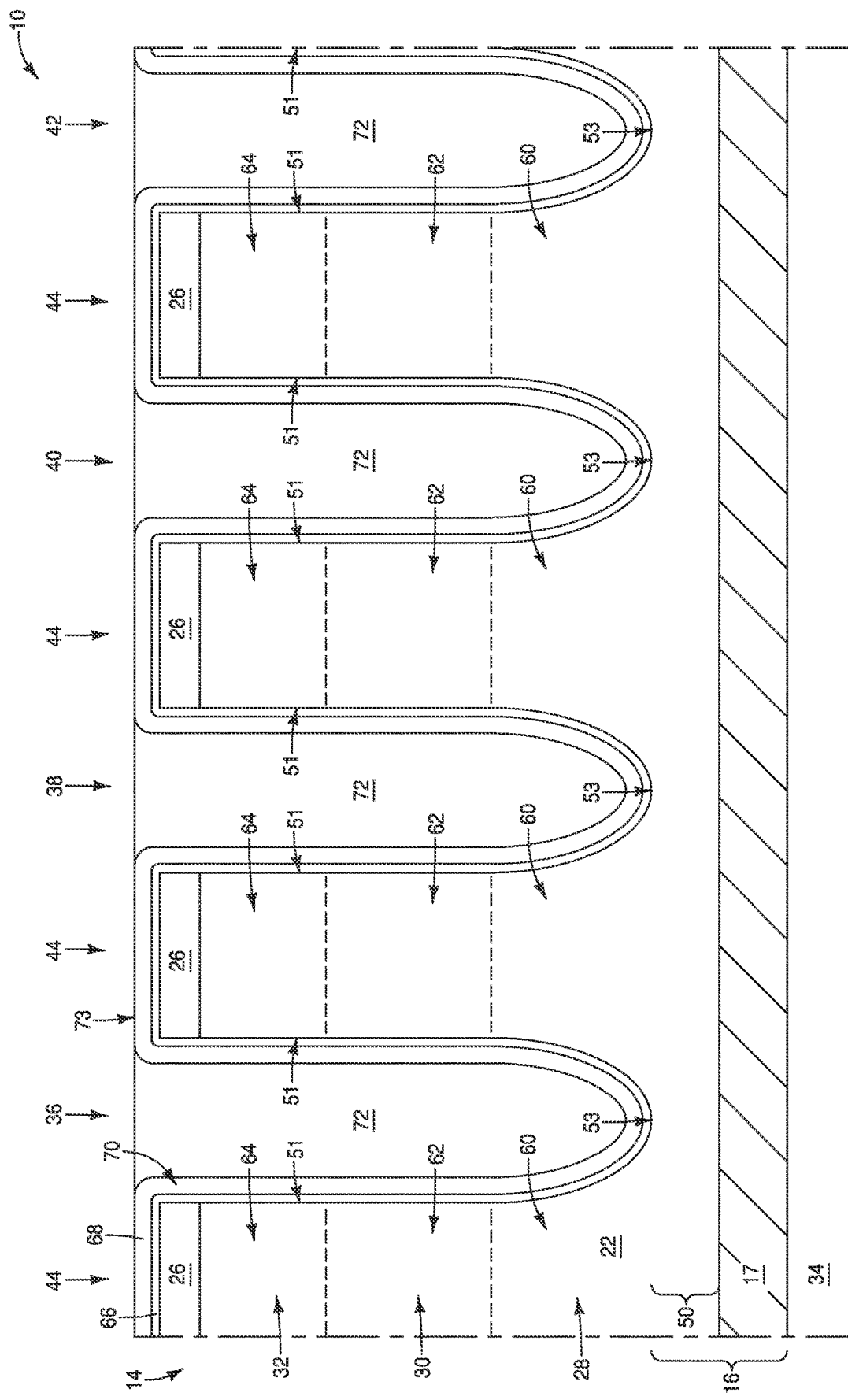

Referring to FIG. 10, planarization is utilized to remove the second material 72 from over the rails 44, and to form a planarized surface 73 extending across the first and second materials 68 and 72. The planarization may utilize any suitable processing; including, for example, chemical-mechanical polishing (CMP). Alternatively, the planarization may be replaced with one or more suitable etches.

Figure 11:
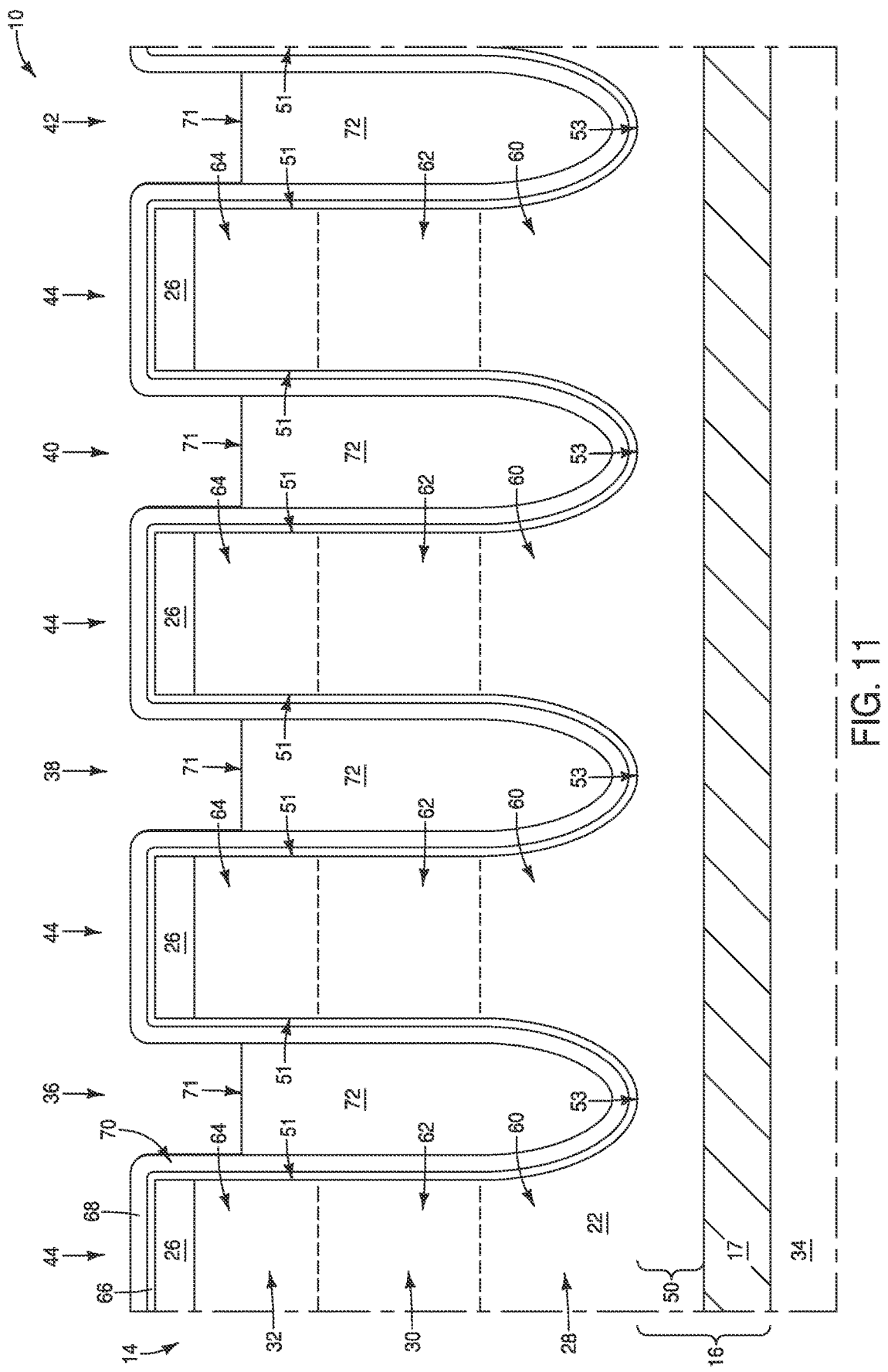

Referring to FIG. 11, the second material 72 is recessed utilizing an etch selective for the second material 72 relative to the first material 68. For purposes of understanding this disclosure and the claims which follow, an etch is considered selective for a first material relative to a second material if the etch removes the first material faster than the second material, which can include, but which is not limited to, etches which are 100% selective for the first material relative to the second material.

The etching of the second material 72 recesses upper surfaces 71 of the second material 72 within the trenches 36, 38, 40 and 42.

Figure 12:
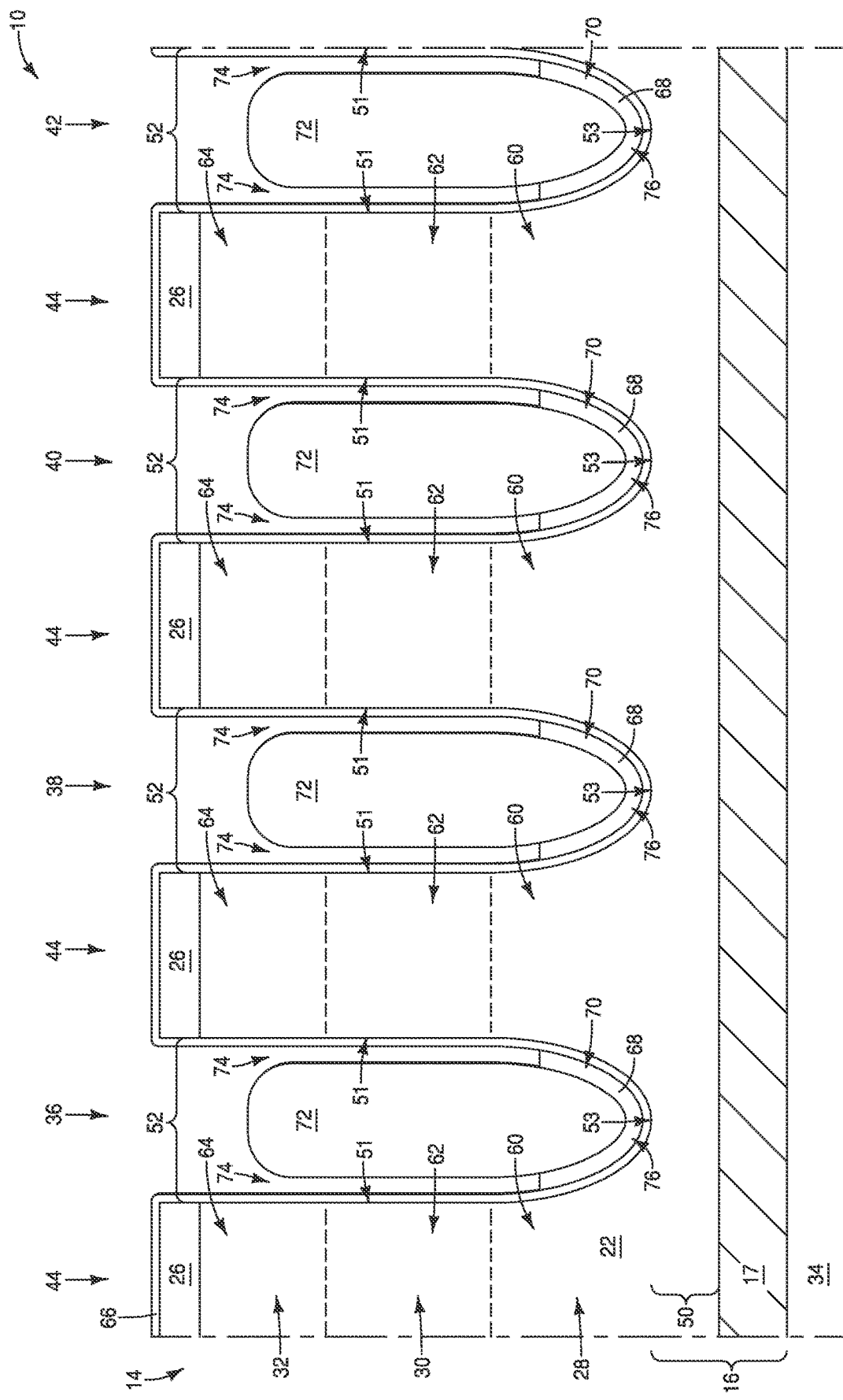

Referring to FIG. 12, portions of the liners 70 are removed to form gaps 74 between the second material 72 and the sidewall surfaces 51 of the rails 44. In some embodiments, the processing of FIG. 12 may be considered to remove first sections of the liners 70 to form the gaps 74, while leaving second sections 76 of the liners 70 remaining under the gaps 74. In the shown embodiment, the second sections 76 of the liners 70 extend along the bottom surfaces 53 of the intervening spaces 52 between the rails 44, and also extend partially up the sidewall surfaces 51 of the rails.

In the shown embodiment, the first material 68 is removed utilizing etching selective for the first material 68 relative to the dielectric material 66 and the second material 72.

The dielectric material 66 is exposed along the gaps 74. The exposed dielectric material 66 may remain along the sidewall surfaces 51 of the rails 44 to be eventually incorporated into vertically-extending transistors as gate dielectric material. Alternatively, regions along the sidewall surfaces 51 may be modified to form improved dielectric material suitable for incorporation into vertically-extending transistors. For instance, at least some of the dielectric material 66 exposed within the gaps 74 may be removed and replaced with additional dielectric material (as shown and described with reference to FIGS. 22 and 23). Additionally, and/or alternatively, the dielectric material 66 exposed within the gaps 74 may be treated to improve the surface characteristics and/or overall quality of the dielectric material. The treatment may comprise a thermal treatment and/or any other suitable treatment. As another example, the dielectric material 66 may remain along the gaps 74, and additional dielectric material may be deposited over the dielectric material 66 to provide an improved dielectric region suitable for utilization as gate dielectric.

Figure 13:
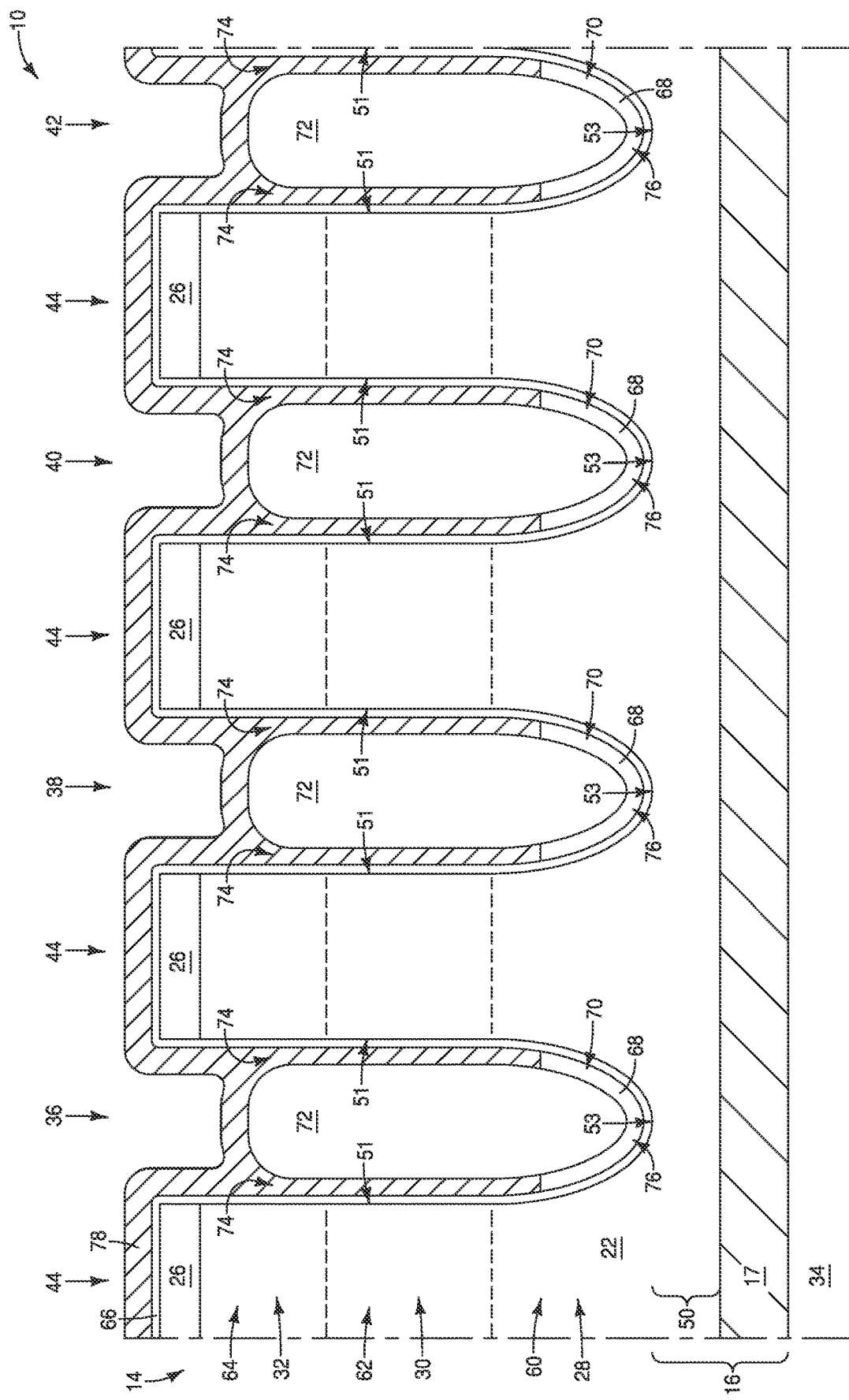

Referring to FIG. 13, conductive material 78 is formed over the rails 44 and within the trenches 36, 38, 40 and 42. The conductive material 78 fills the gaps 74.

The conductive material 78 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 78 may comprise metal (e.g., may comprise one or more of titanium, tungsten, titanium nitride, tungsten nitride, etc.).

Figure 14:
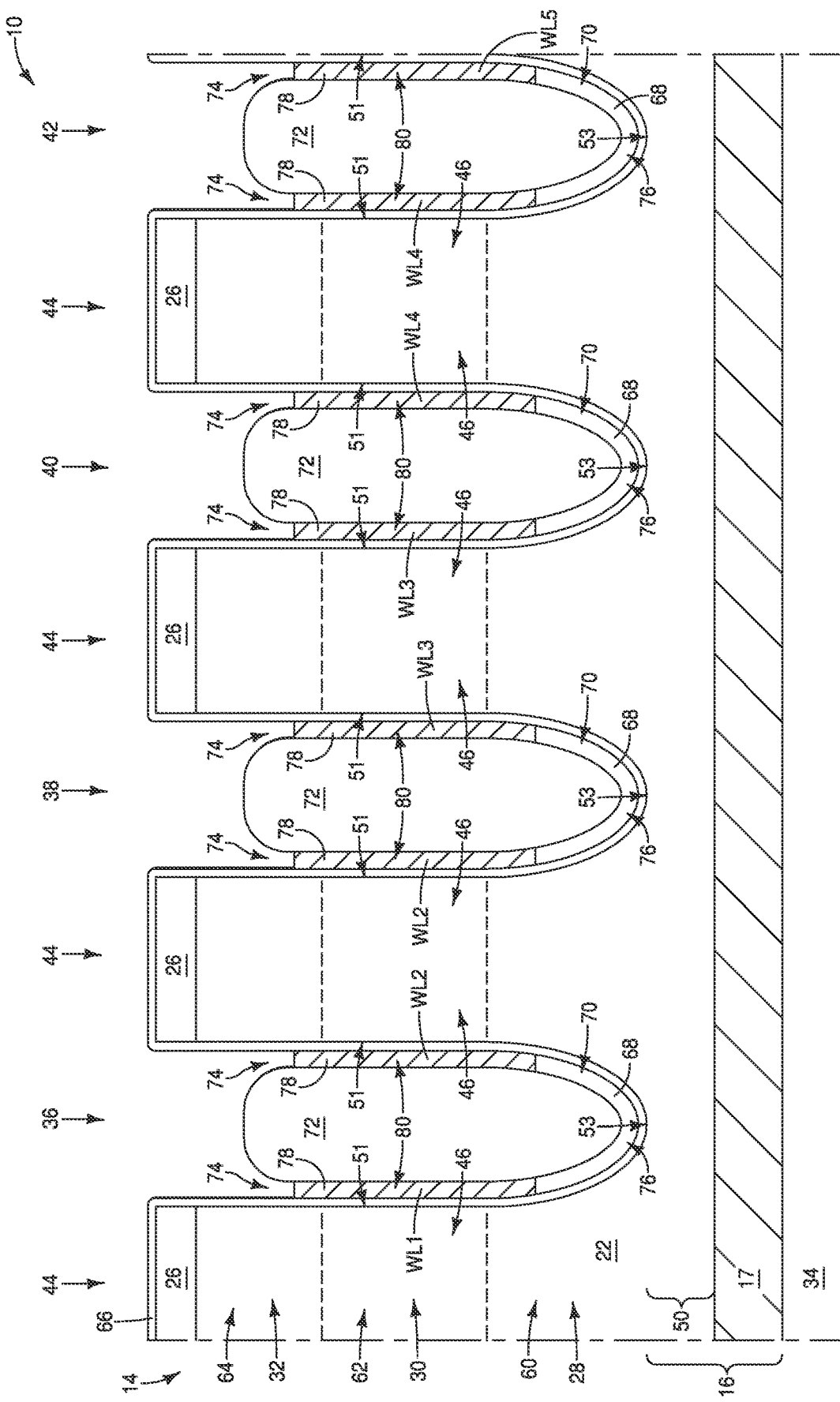

Referring to FIG. 14, the conductive material 78 is patterned to form the conductive material into conductive lines 80 extending along the rails 44 (i.e., extending in and out of the page relative to the cross-sectional view of FIG. 14). Such conductive lines may be considered to extend along the second direction of the axis 7 described above with reference to FIGS. 1-7. The conductive lines 80 comprise transistor gates along the channel regions 30 (i.e., along the middle segments 62 of the vertically-extending pillars 46). The conductive lines 80 overlap the channel regions 30, and may or may not overlap interfaces between the channel regions and the adjacent source/drain regions 28 and 32.

The conductive lines 80 may be incorporated into wordlines that extend in and out of the page relative to the cross-section sectional view of FIG. 14. The conductive lines 80 on either side of a pillar 46 may be together comprised by a single wordline. For instance, the illustrated conductive lines 80 are shown incorporated into wordlines WL1, WL2, WL3, WL4 and WL5.

Figure 15:
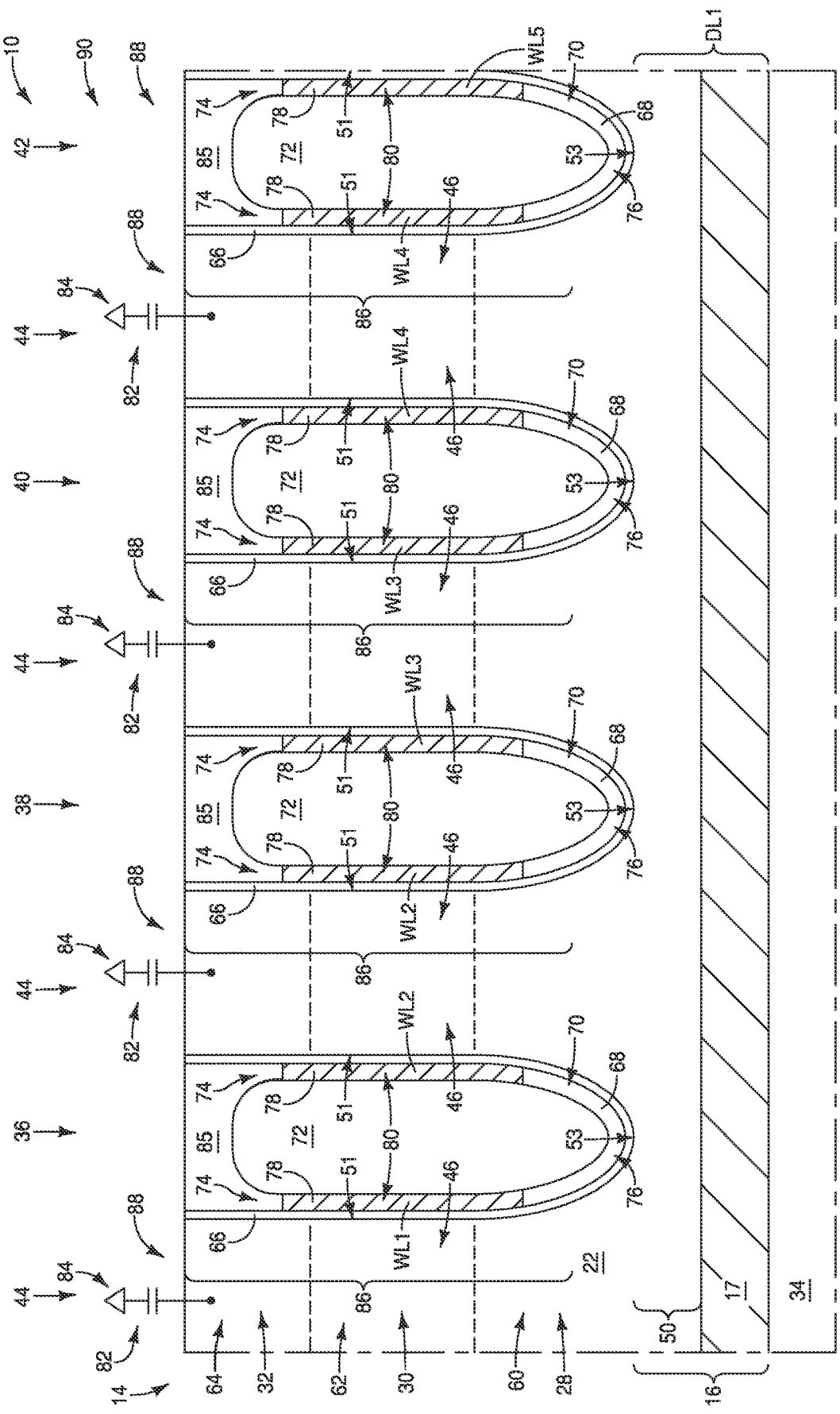

Referring to FIG. 15, the protective material 26 (FIG. 14) is removed from over the upper source/drain regions 32 to expose such regions. Subsequently, the upper source/drain regions 32 are coupled with charge-storage devices 82. The charge-storage devices are illustrated to be capacitors, but it is to be understood that the devices 82 may be any suitable charge-storage devices. In the shown embodiment in which the devices 82 are capacitors, such capacitors have first nodes coupled with the upper source/drain regions 32, and have second nodes coupled with a reference voltage 84. Such reference voltage may be ground, or any other suitable reference voltage.

Additional insulative material 85 is formed over the conductive lines 80 and the insulative material 72. The additional insulative material 85 may comprise any suitable composition(s); and in some embodiments may comprise, consist essentially of, or consist of silicon dioxide.

The digit line 16 of FIG. 15 may be considered to be a representative example of the many digit lines which may be associated with a memory array, and is illustrated to be a digit line DL1. The digit line DL1 extends along a first direction corresponding to the direction of the axis 5 of FIG. 1. The wordlines WL1-WL5 may be considered to be representative examples of the many wordlines which may be associated with the memory array. The wordlines extend along a second direction corresponding to the direction of the axis 7 of FIG. 1. The regions 28, 30 and 32 within the pillars 46 may be considered to be comprised by vertical transistors 86 which are gated by gates along the wordlines WL1-WL5. The vertical transistors 86, together with the charge-storage devices 82, may be considered to form memory cells 88 of a memory array 90 (e.g., a DRAM array).

Figure 16:
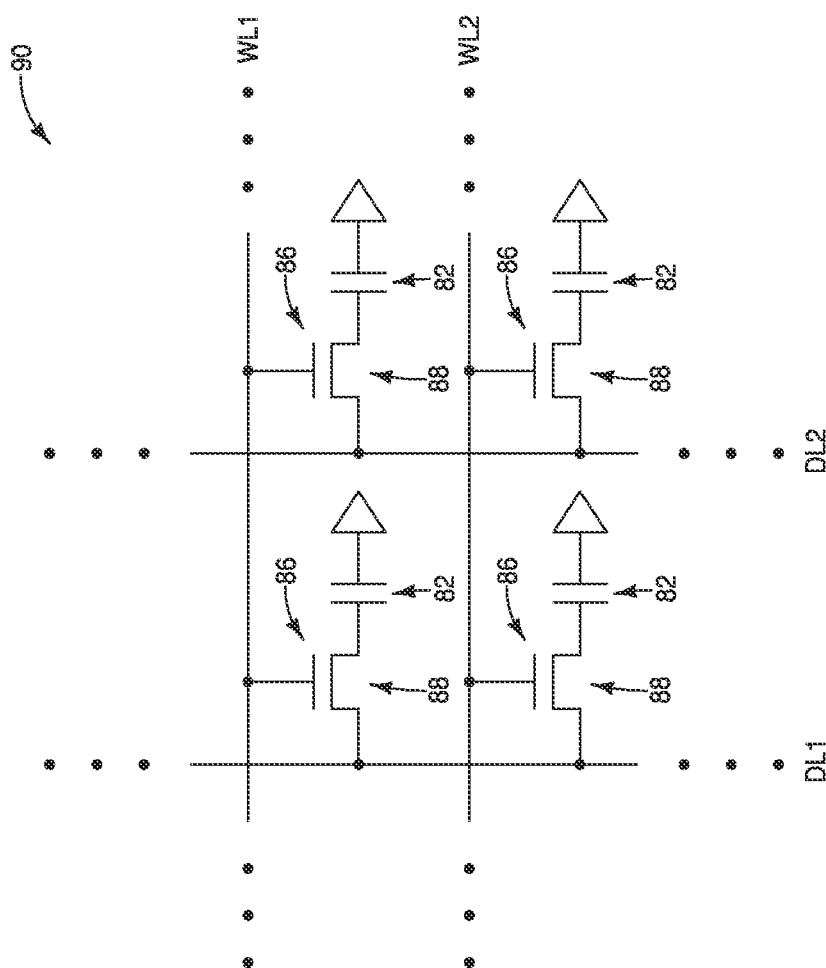
FIG. 16 is a schematic diagram of a region of an example memory array.

FIG. 16 schematically illustrates a region of the example DRAM array 90. Such region comprises a plurality of the memory cells 88, with each of the memory cells including a capacitor 82 and a transistor 86. The illustrated region of the memory array comprises two digit lines (DL1 and DL2) and two wordlines (WL1 and WL2), together with four memory cells. It is to be understood that the memory array may have any suitable number of wordlines, digit lines and memory cells.

Advantages of the processing described above with reference to FIGS. 1-16 may include that the processing may be particularly suitable for trenches having very high aspect ratios (i.e., for fabrication of highly-integrated architectures). Specifically, a problem that can occur when utilizing conventional fabrication technologies to form wordlines in high-aspect-ratio trenches is that the conductive material from adjacent wordlines will short across the bottoms of the trenches. The methodology of FIGS. 1-15 may alleviate such problem by providing the liner sections 76 along the bottoms of the trenches to thereby maintain desired spacing and electrical isolation between wordline components formed along opposing sides of the trenches. Another advantage is that in some embodiments the gaps 74 may be considered to define the aspect ratios for the conductive lines 80 provided along the vertically-extending pillars 46, which can enable the conductive lines 80 to be formed to a common thickness across multiple pillars; even if in applications in which trenches between the pillars have considerably different aspect ratios. Such advantage is described in more detail with reference to FIGS. 17-21.

Figure 17:
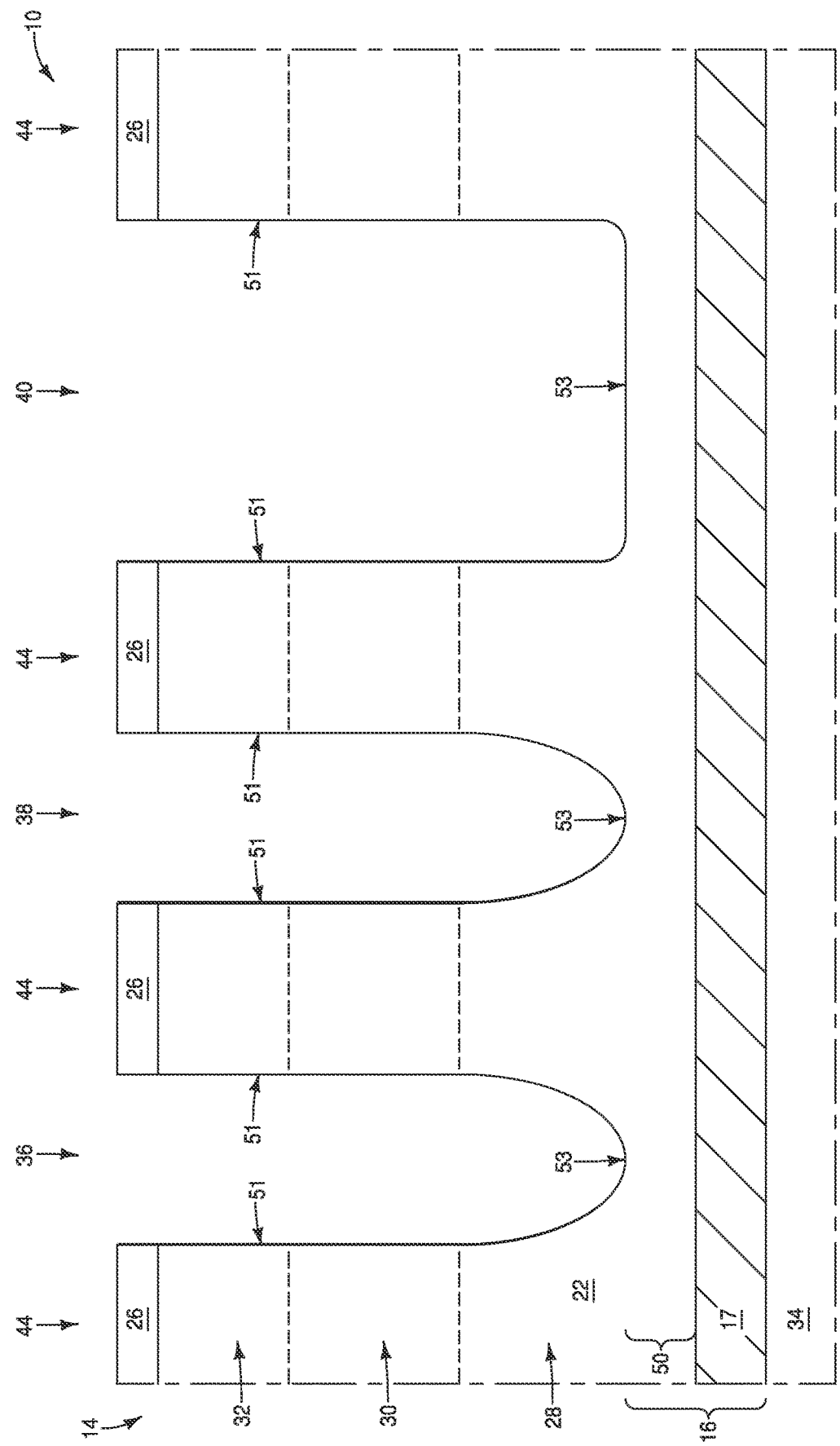
FIG. 17 is a diagrammatic cross-sectional side view along the same cross-section as FIG. 6 of an alternative example assembly shown at an example processing stage analogous to that of FIG. 6.

Referring to FIG. 17, construction 10 is shown at a process stage analogous to that described above with reference to FIG. 6. Trenches 36, 38 and 40 are formed to extend into the semiconductor material 22. The trench 40 has a greater width than the trenches 36 and 38 along the cross-section of FIG. 17. Such may be purposeful in some embodiments, or may result from undesired errors during patterning and/or etching. It may be difficult to form desired gate structures within trenches of varying widths with conventional processing. In contrast, methodology of the present invention can form desired gate structures within all of the trenches 36, 38 and 40, regardless of the variation in width amongst such trenches; as is shown below in subsequent figures.

The interior regions of the trenches 36, 38 and 40 have the sidewall surfaces 51 and the bottom surfaces 53.

Figure 18:
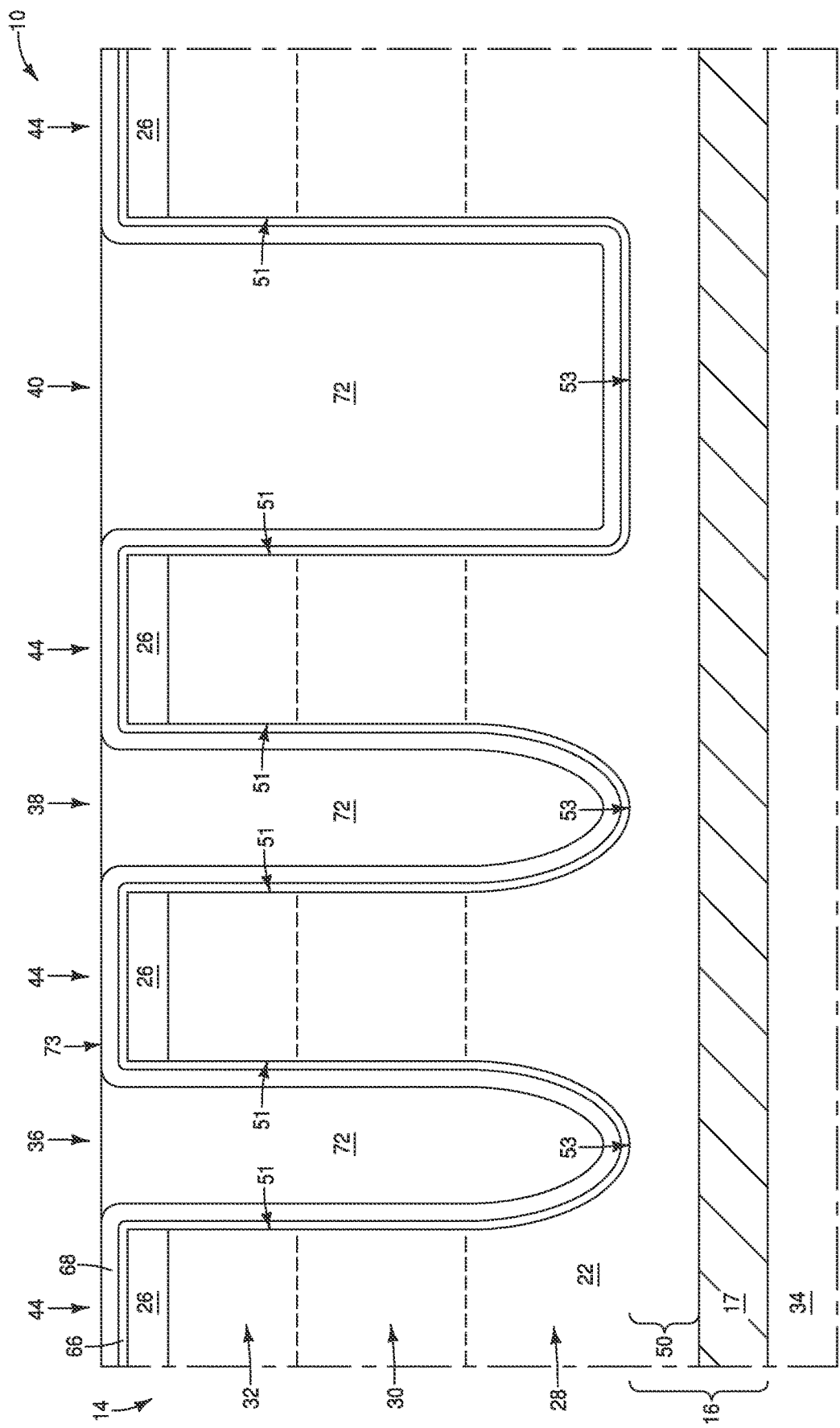
FIGS. 18-21 are diagrammatic cross-sectional side views of the example assembly of FIG. 17 shown at example processing stages which may follow that of FIG. 17.

Referring to FIG. 18, the construction 10 is shown at a processing stage subsequent to that of FIG. 17, and analogous to that of FIG. 10. The dielectric material 66 is formed over the rails 44 and within the trenches 36, 38 and 40. The first material 68 is formed over the dielectric material 66, and the second material 72 is formed over the first material 68. Subsequently, the planarized surface 73 is formed to extend across the materials 68 and 72.

Figure 19:
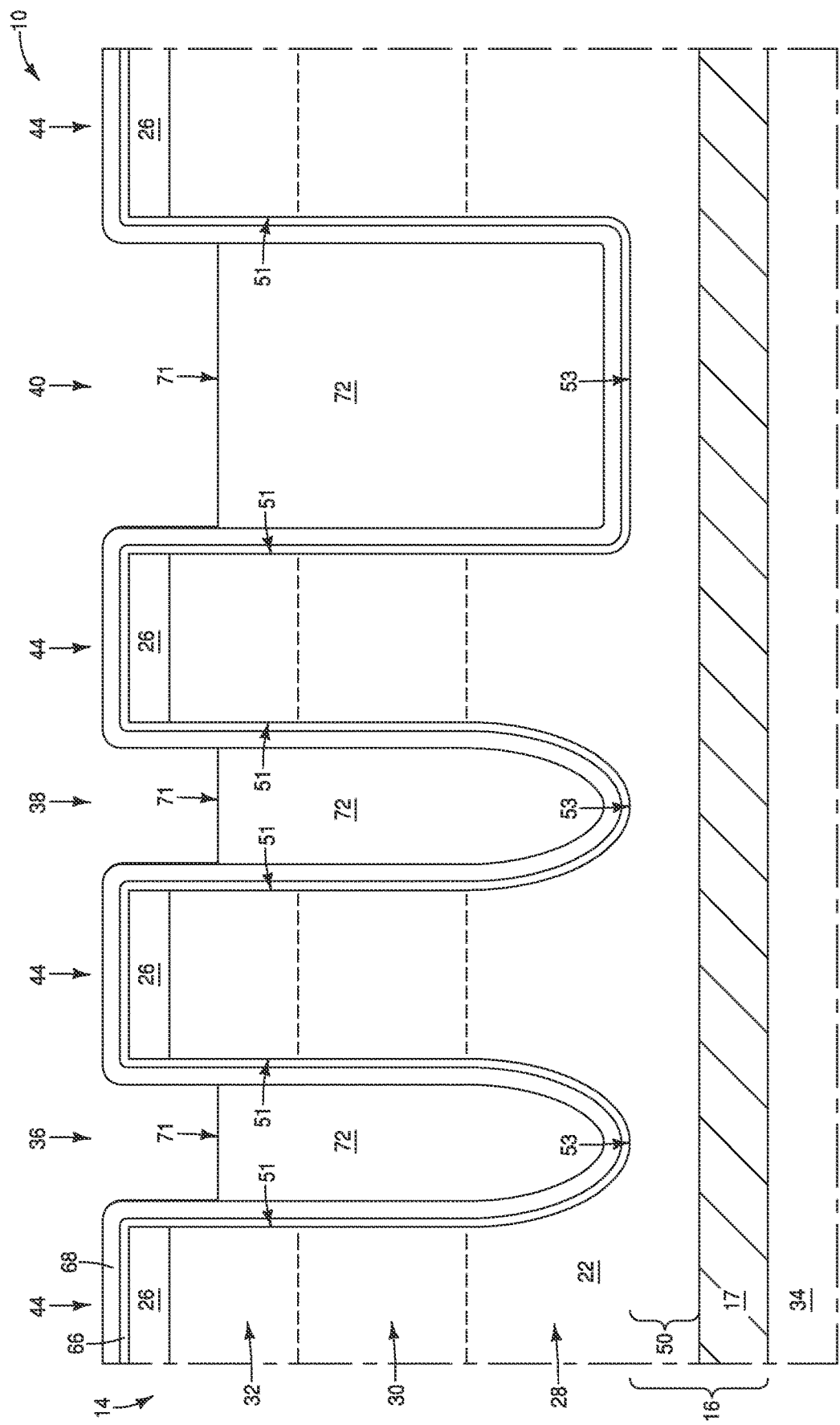

Referring to FIG. 19, the construction 10 is shown at a processing stage subsequent to that of FIG. 18, and analogous to that of FIG. 11. The upper surfaces 71 of the second material 72 are recessed within the trenches 36, 38 and 40.

Figure 20:
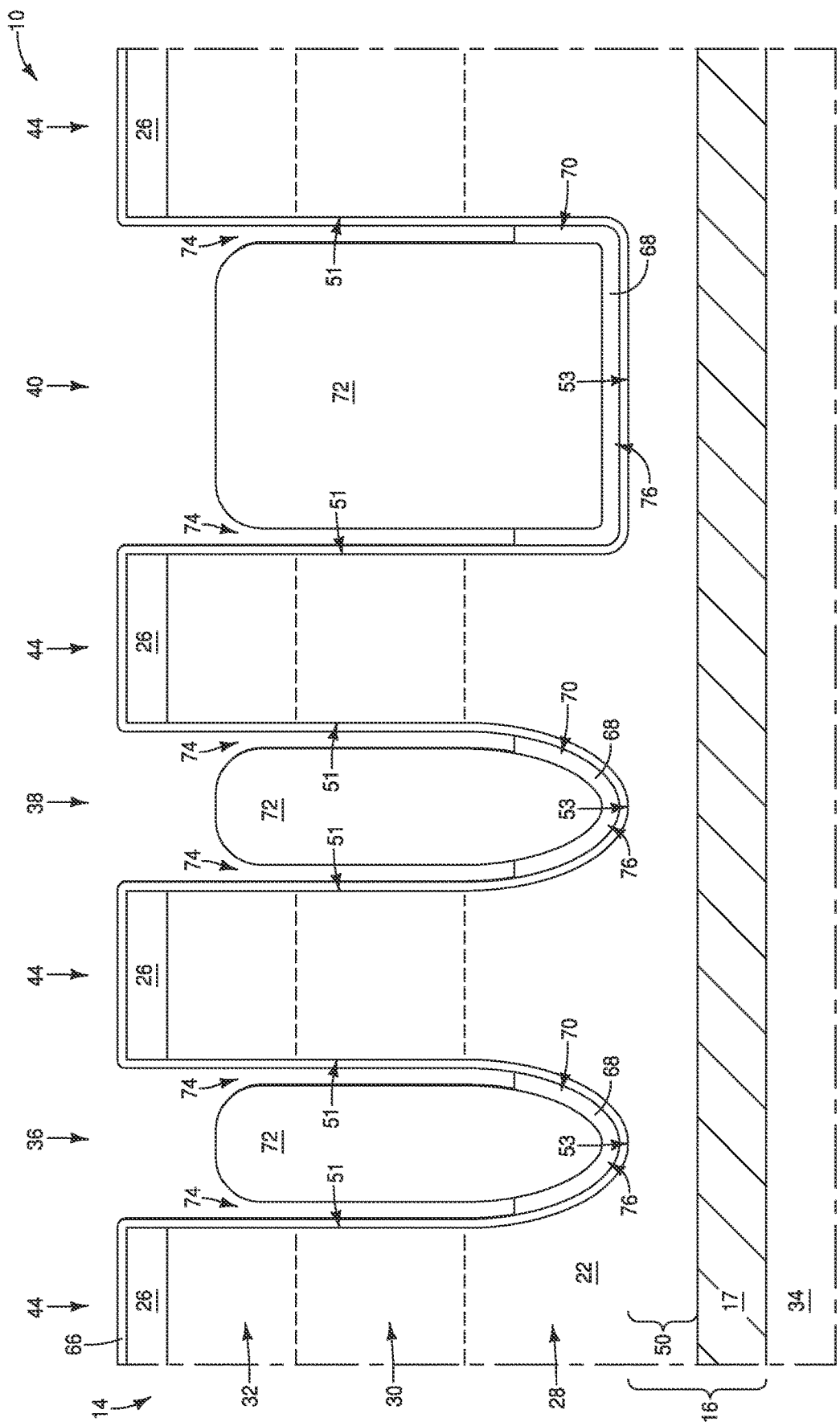

Referring to FIG. 20, the construction 10 is shown at a processing stage subsequent to that of FIG. 19, and analogous to that of FIG. 12. A portion of the first material 68 is removed to form the gaps 74 between the second material 72 and the sidewall surfaces 51 of the rails 44. The second sections 76 of the liners 70 remain under the gaps 74 and along the bottom surfaces 53 of the trenches 36, 38 and 40.

Figure 21:
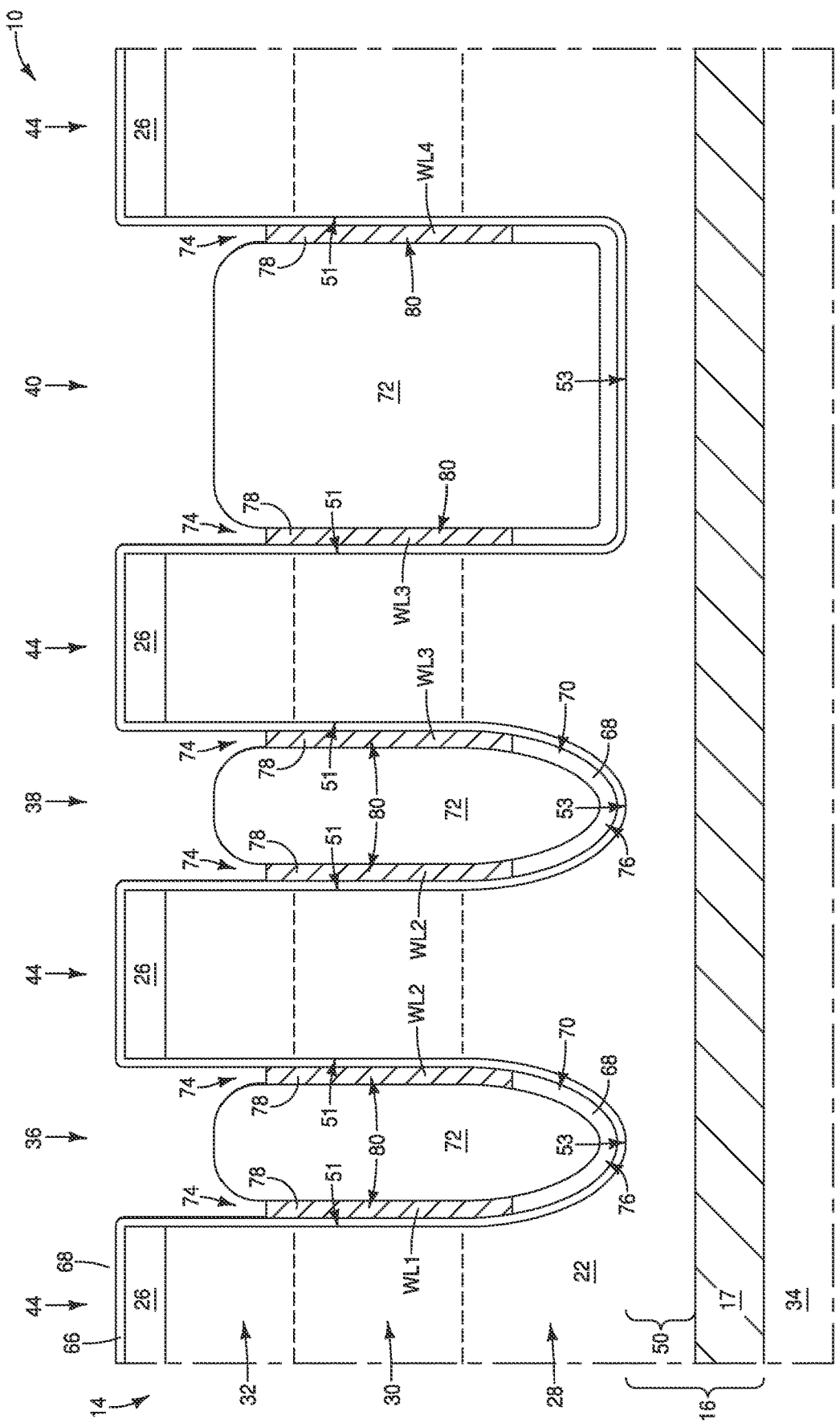

Referring to FIG. 21, the construction 10 is shown at a processing stage subsequent to that of FIG. 20, and analogous to that of FIG. 14. The conductive material 78 is formed within the gaps 74 and is patterned into the conductive lines 80. The conductive lines 80 are all of about the same lateral thickness as one another, even though some of the conductive lines were formed within the wide trench 40 while others of the conductive lines were formed within the narrower trenches 36 and 38. Such is an advantage of having the gaps 74 utilized to define the widths of the conductive lines, in that such gaps will have about the same widths as one another regardless of whether the gaps are formed within wide trenches or narrow trenches (i.e., the widths of the gaps 74 are independent of the lateral widths of the trenches that the gaps are formed in). The gaps are indicated to have "about the same widths as one another," with the term "about the same" meaning the same to within reasonable tolerances of fabrication and measurement.

The conductive lines 80 comprise transistor gates along the channel regions 30, and are incorporated into wordlines WL1, WL2, WL3 and WL4. In subsequent processing, the construction 10 of FIG. 21 may be incorporated into a memory array of the type described above with reference to FIGS. 15 and 16. For instance, the upper source/drain regions 32 may be coupled with appropriate charge-storage devices analogous to the devices 82 described above with reference to FIG. 15.

Figure 22:
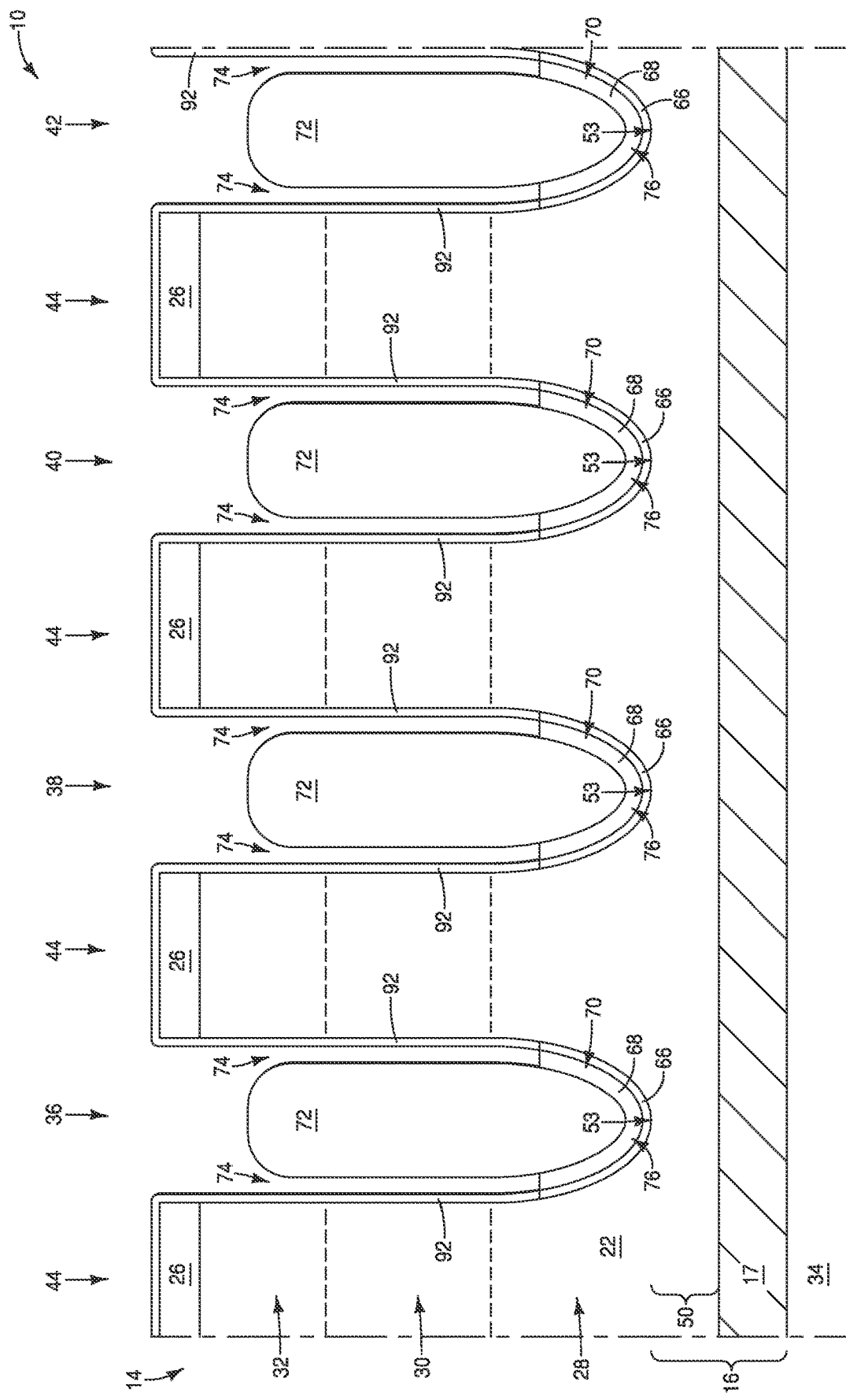
FIGS. 22 and 23 are diagrammatic cross-sectional side views of example process stages that may follow the process stage of FIG. 12.

In some embodiments, at least some of the dielectric material 66 may be replaced prior to forming the conductive lines 80. For instance, FIG. 22 shows construction 10 at a processing stage which may follow that of FIG. 12. The dielectric material 66 which had been exposed over the rails 44 and within the gaps 74 at the process stage of FIG. 12 is replaced with a different dielectric material 92. The dielectric material 92 may comprise any suitable composition(s) suitable for utilization as gate dielectric within transistor devices; and in some embodiments may comprise, consist essentially of, or consist of silicon dioxide.

Figure 23:
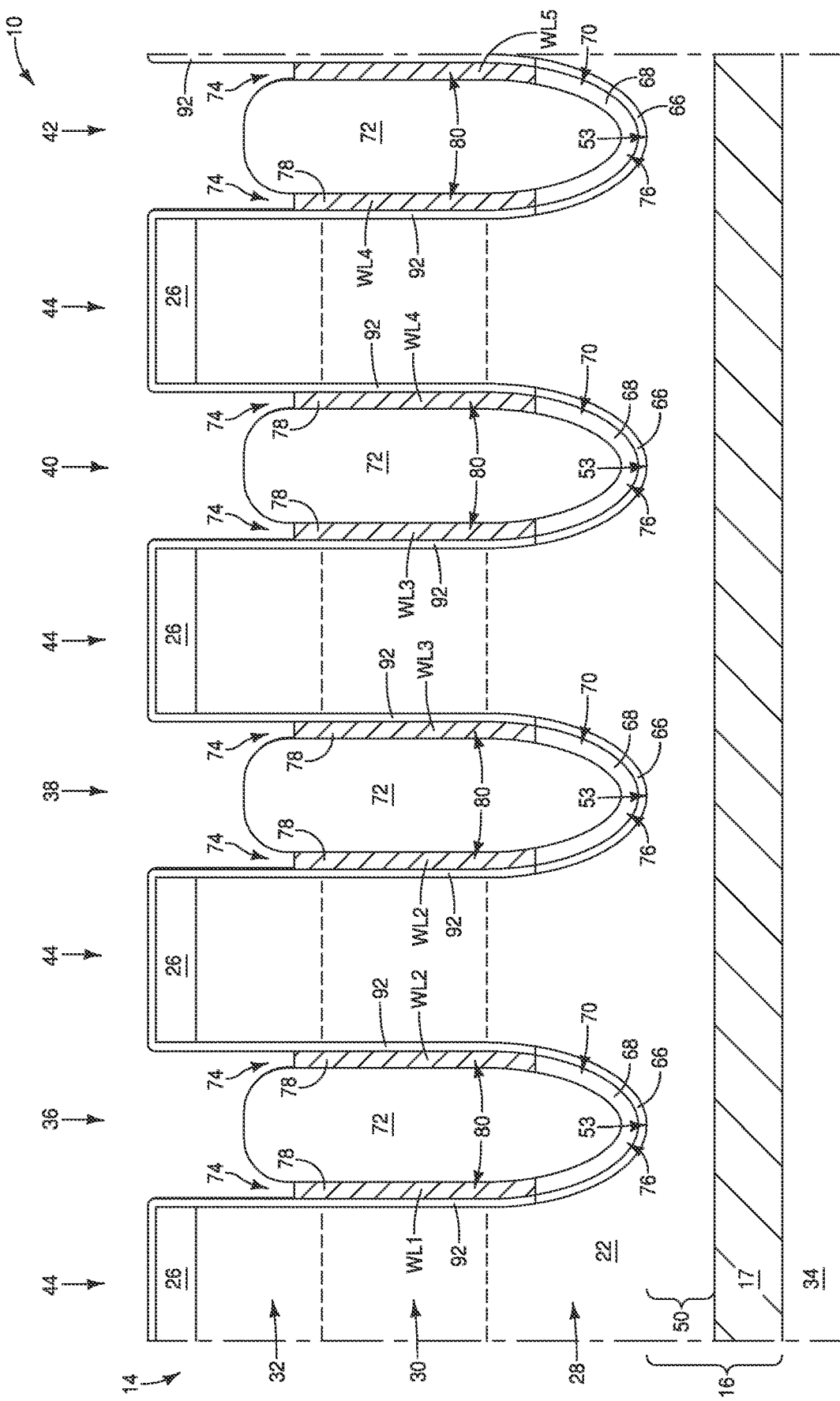

Referring to FIG. 23, the construction 10 is shown at a processing stage subsequent to that of FIG. 22, and analogous to that of FIG. 14. The conductive material 78 is formed within the gaps 74 and is patterned into the conductive lines 80.

The conductive lines 80 comprise transistor gates along the channel regions 30, and are incorporated into the wordlines WL1-WL5. In subsequent processing, the construction 10 of FIG. 23 may be incorporated into a memory array of the type described above with reference to FIGS. 15 and 16. For instance, the upper source/drain regions 32 may be coupled with appropriate charge-storage devices analogous to the devices 82 described above with reference to FIG. 15.

In some embodiments, processing analogous to that discussed above may be utilized to form wordlines having two or more conductive materials therein. The conductive materials may have different work functions relative to one another which may enable the wordlines to be tailored for specific applications.

Figure 24:
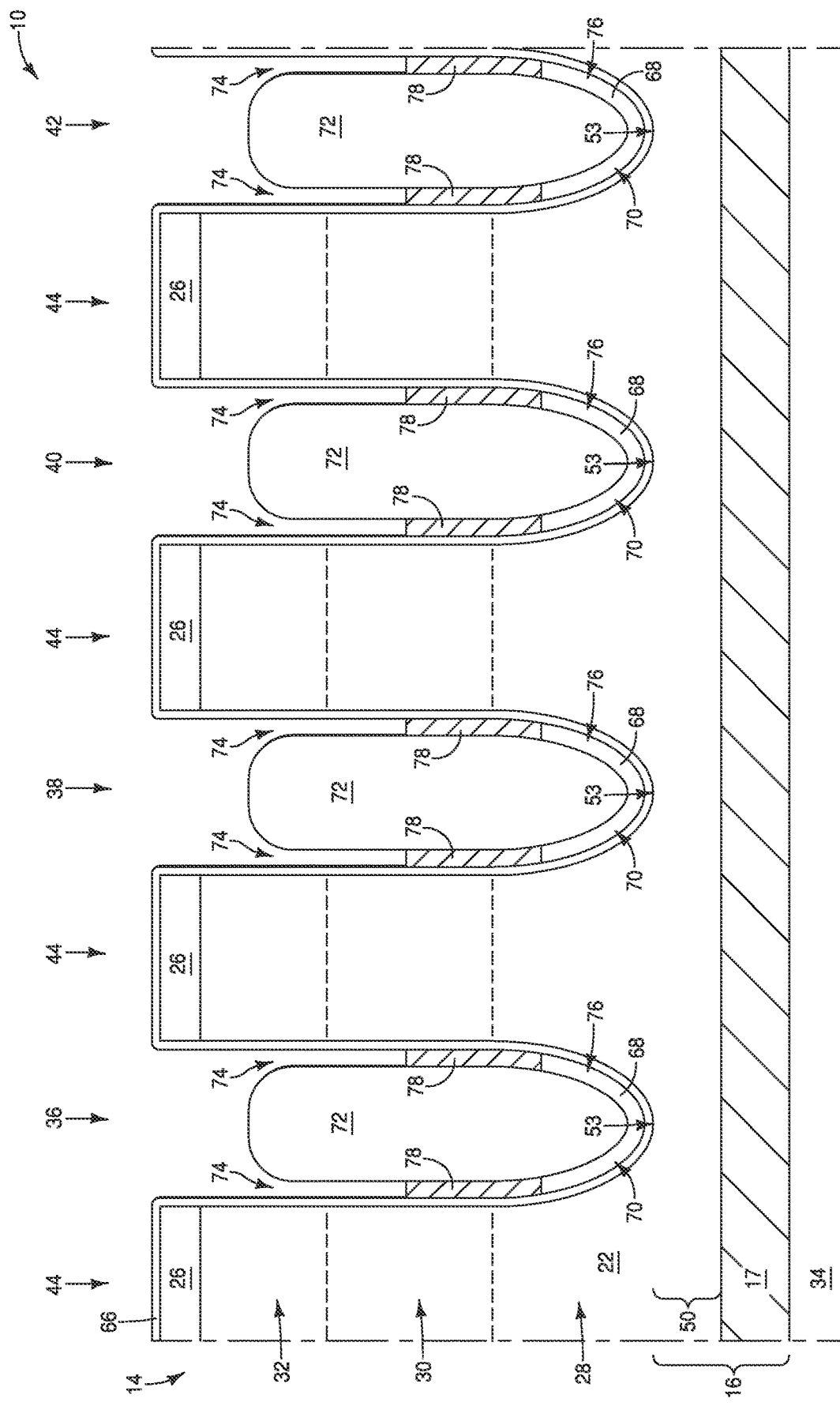
FIGS. 24-26 are diagrammatic cross-sectional side views of example process stages that may follow the process stage of FIG. 13.

FIG. 24 shows construction 10 at a processing stage which may follow that of FIG. 13. The conductive material 78 is recessed so that such conductive material is within lower regions of the gaps 74, leaving unfilled upper regions of the gaps remaining over such lower regions.

Figure 25:
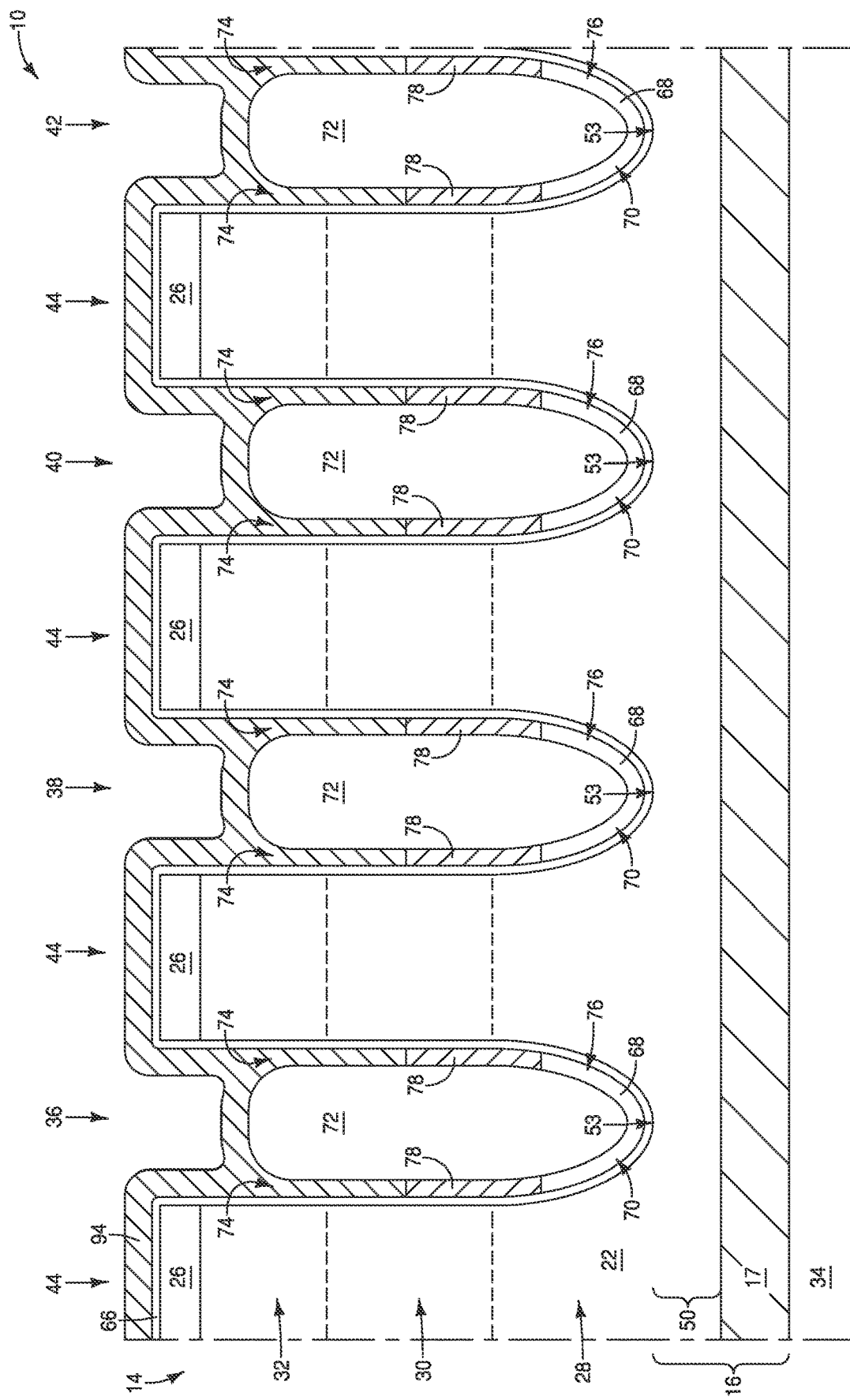

Referring to FIG. 25, the construction 10 is shown at a processing stage subsequent to that of FIG. 24. A second conductive material 94 is formed over the rails 44 and within the trenches 36, 38, 40 and 42. The second conductive material 94 fills the upper regions of the gaps 74 over the first conductive material 78. The conductive material 94 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 94 may comprise metal (e.g., may comprise one or more of titanium, tungsten, titanium nitride, tungsten nitride, etc.), and may have a different composition (and a different workfunction) than the conductive material 78.

Figure 26:
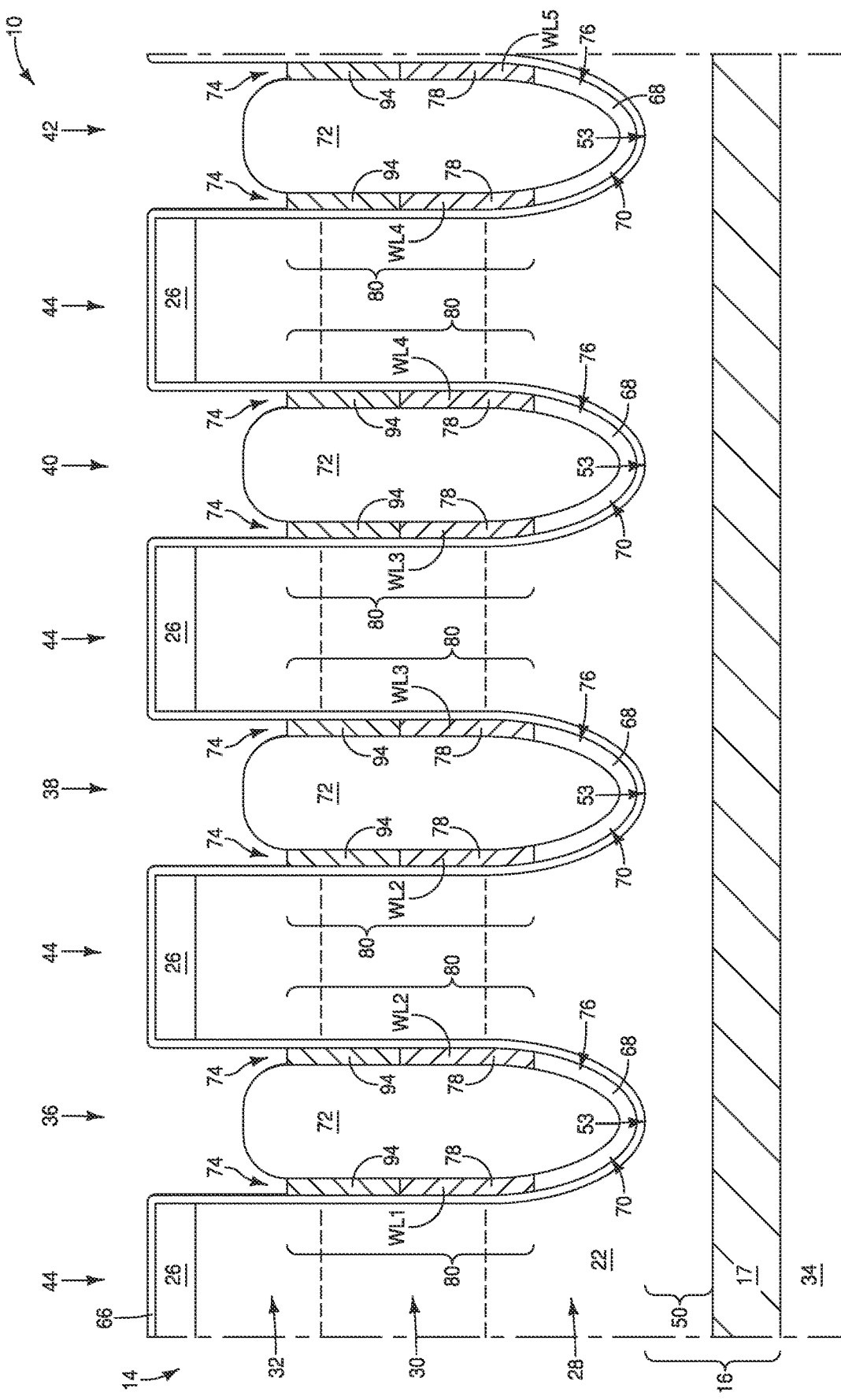

Referring to FIG. 26, the conductive materials 78 and 94 are patterned to form the conductive lines 80; with each of the conductive lines 80 comprising both of the materials 78 and 94. The conductive lines 80 comprise transistor gates along the channel regions 30, and are incorporated into the wordlines WL1-WL5. In subsequent processing, the construction 10 of FIG. 26 may be incorporated into a memory array of the type described above with reference to FIGS. 15 and 16. For instance, the upper source/drain regions 32 may be coupled with appropriate charge-storage devices analogous to the devices 82 described above with reference to FIG. 15.

Figure 27:
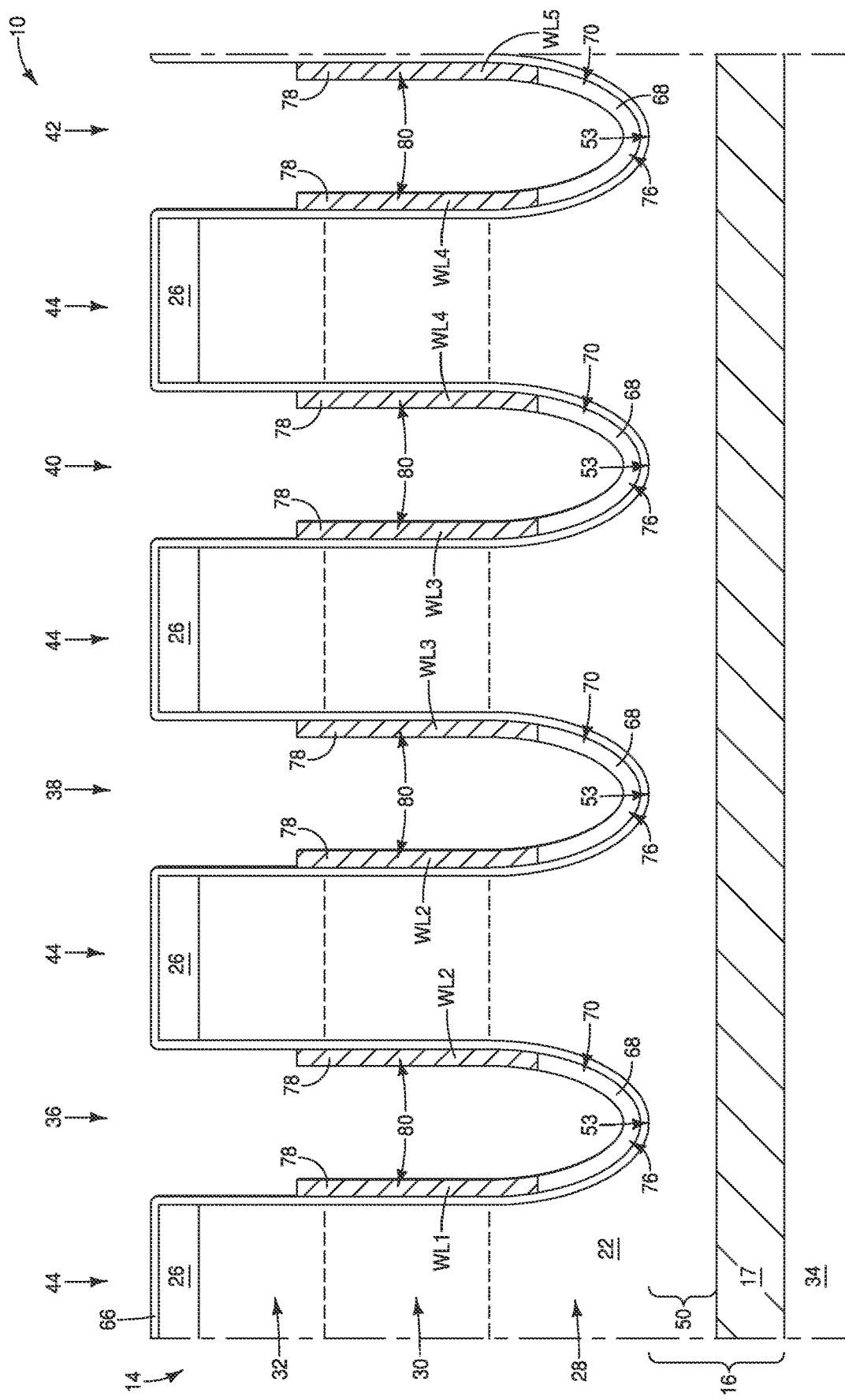
FIG. 27 is a diagrammatic cross-sectional side view of an example process stage that may follow the process stage of FIG. 14.

In some embodiments, the second material 72 may be removed after forming the conductive lines 80. For instance, FIG. 27 shows construction 10 at a processing stage which may follow that of FIG. 14. The second material 72 (FIG. 14) has been removed from within the trenches 36, 38, 40 and 42. In the embodiment of FIG. 27, the material 72 is a sacrificial material. The material 72 may comprise any suitable composition. In some embodiments, the sacrificial material 72 may comprise, consist essentially of, or consist of silicon (e.g., polycrystalline silicon), which may or may not be doped. In some embodiments, the sacrificial material 72 may comprise, consist essentially of, or consist of silicon dioxide.

The conductive lines 80 of FIG. 27 comprise transistor gates along the channel regions 30, and are incorporated into the wordlines WL1-WL5. In subsequent processing, the construction 10 of FIG. 27 may be incorporated into a memory array of the type described above with reference to FIGS. 15 and 16. For instance, the upper source/drain regions 32 may be coupled with appropriate charge-storage devices analogous to the devices 82 described above with reference to FIG. 15.

In some embodiments, the second sections 76 of the liners 70 may be removed after forming the conductive lines 80. An example of such embodiments is described with reference to FIGS. 28-31.

Figure 28:
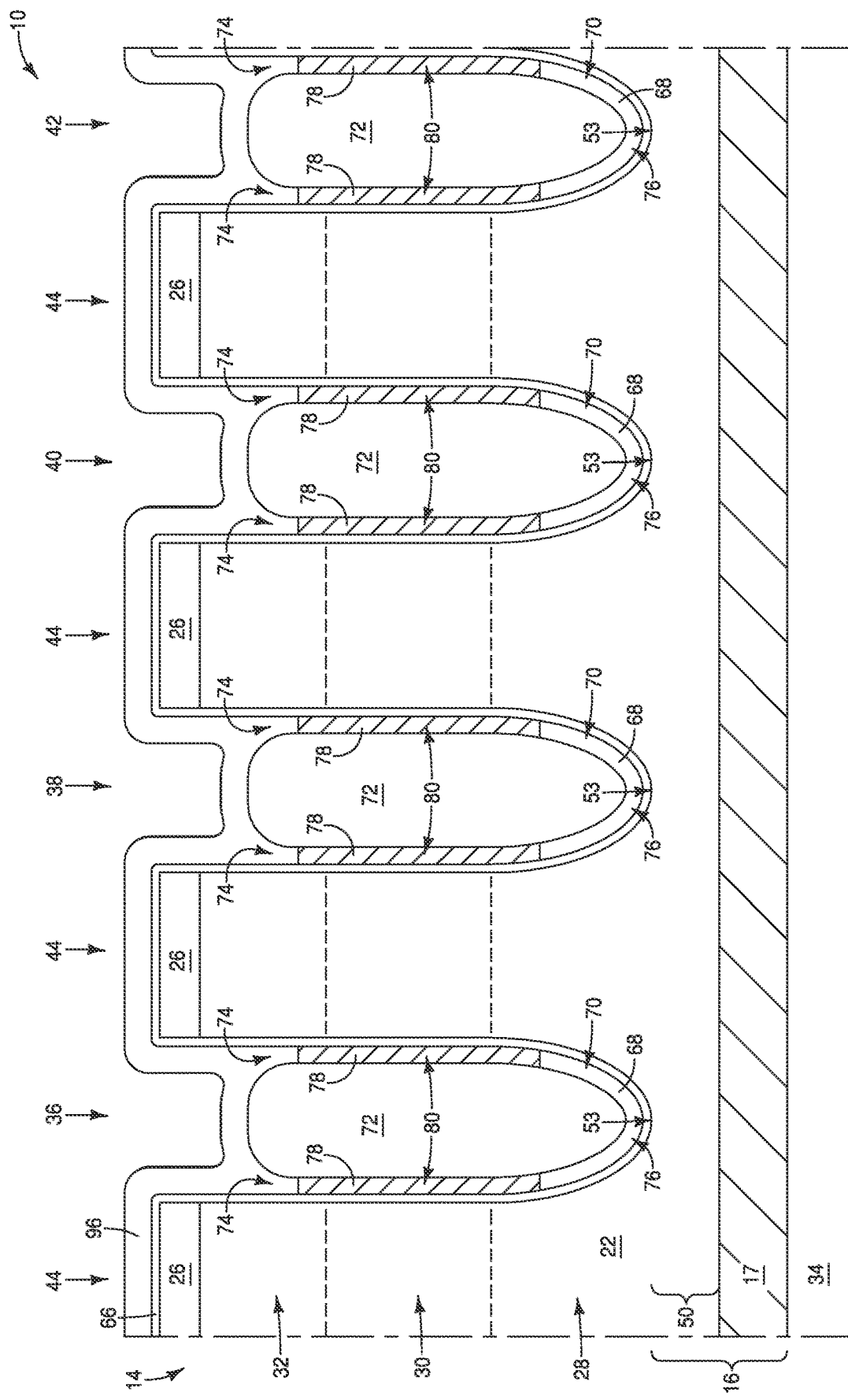
FIG. 28 is a diagrammatic cross-sectional side view of an example process stage that may follow the process stage of FIG. 14.

FIG. 28 shows construction 10 at a processing stage which may follow that of FIG. 14. In the embodiment of FIG. 28, the first material 68 may comprise, consist essentially of, or consist of silicon (e.g., polycrystalline silicon), which may or may not be doped. A protective material 96 is formed over the rails 44 and within the trenches 36, 38, 40 and 42. The protective material 96 may comprise any suitable composition(s); and in some embodiments may comprise, consist essentially of, or consist of silicon nitride.

Figure 29:
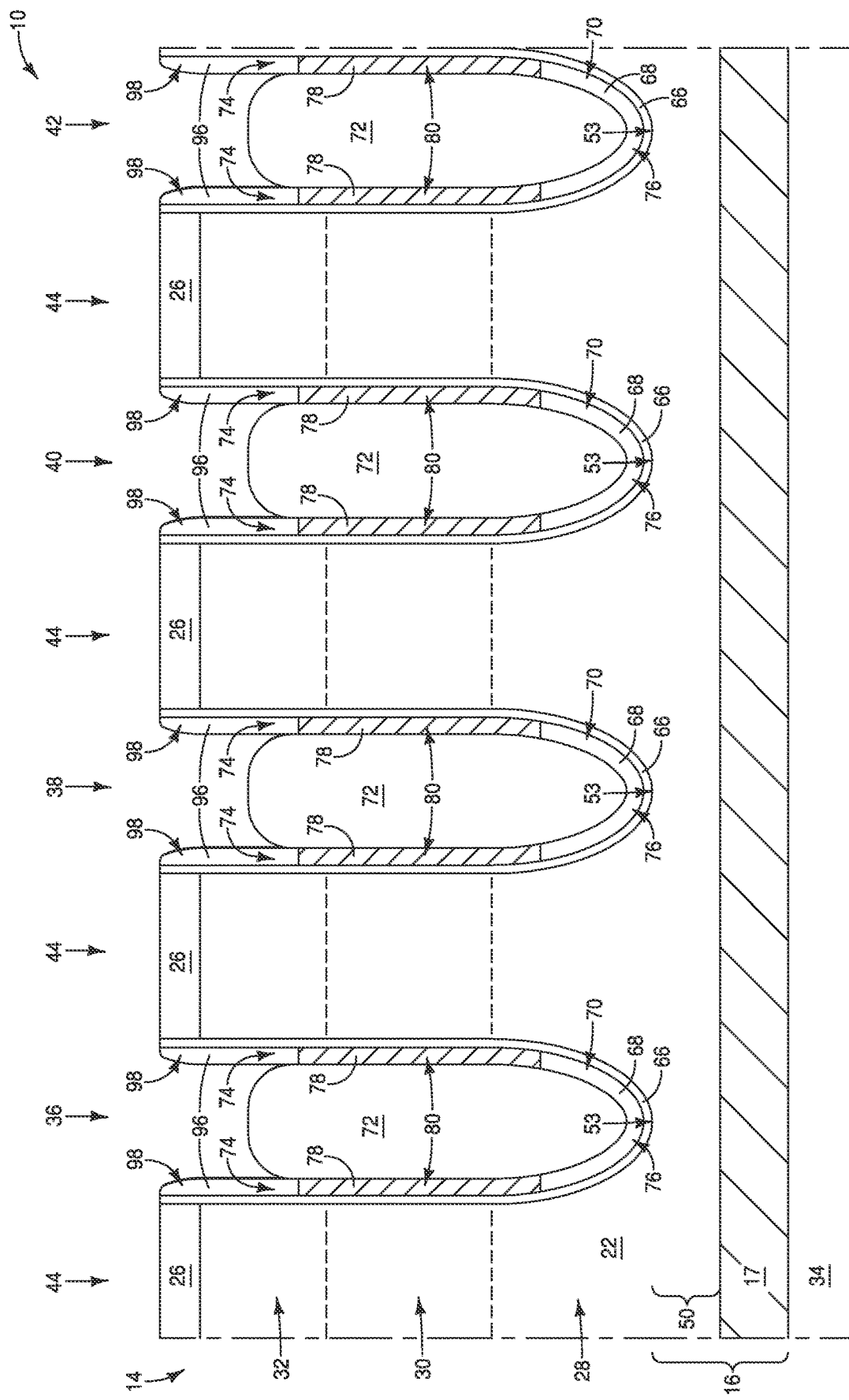
FIGS. 29-31 are diagrammatic cross-sectional side views of example processing stages that may follow the process stage of FIG. 28.

Referring to FIG. 29, the protective material 96 is patterned into spacers 98, which are over the conductive lines 80. In the shown embodiment, the spacers 98 have bottom regions which extend into the gaps 74.

Figure 30:
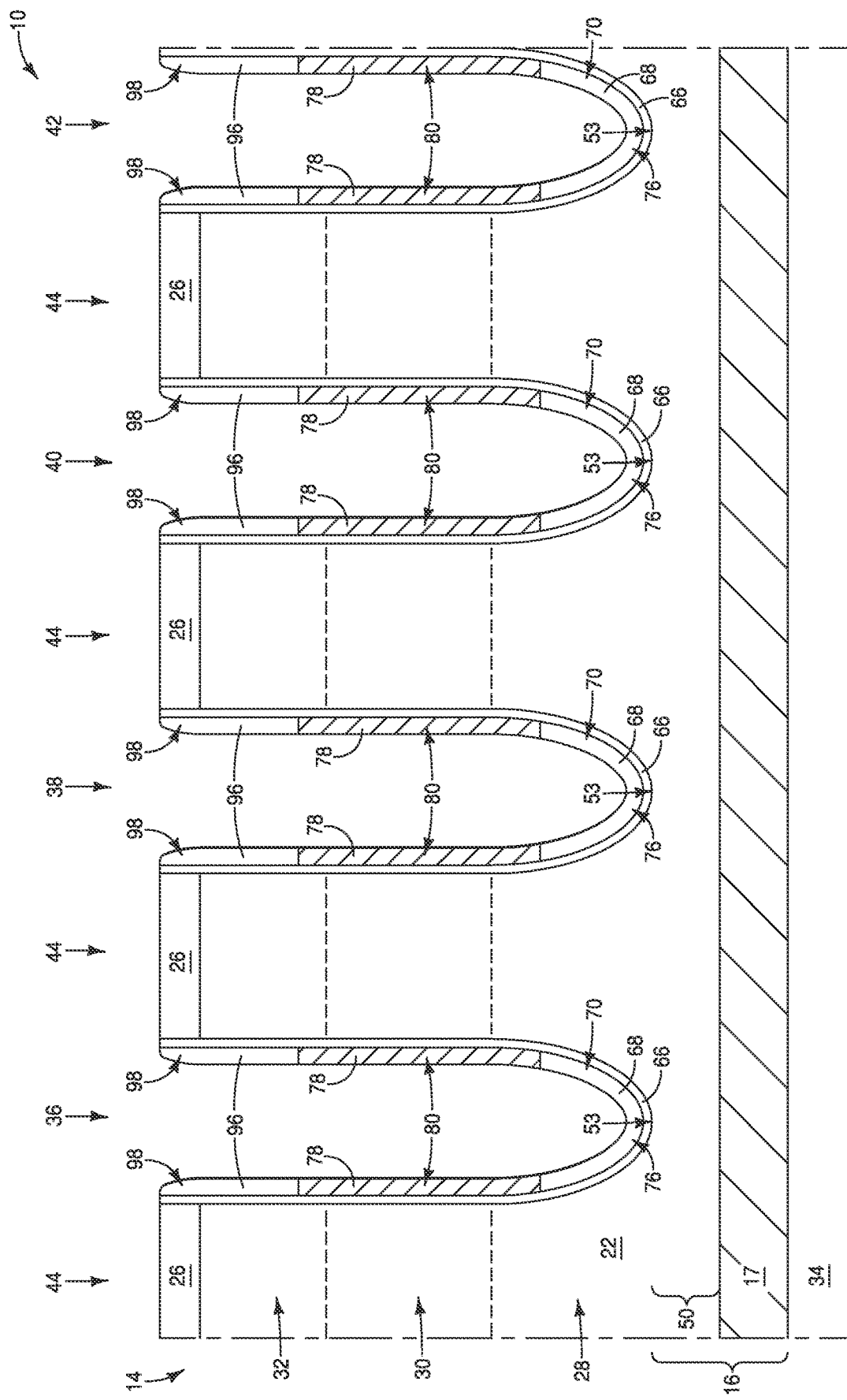

Referring to FIG. 30, the second material 72 (FIG. 29) is removed from within the trenches 36, 38, 40 and 42; and in the shown embodiment is removed while utilizing the spacers 98 to protect upper surfaces of the conductive lines 80.

Figure 31:
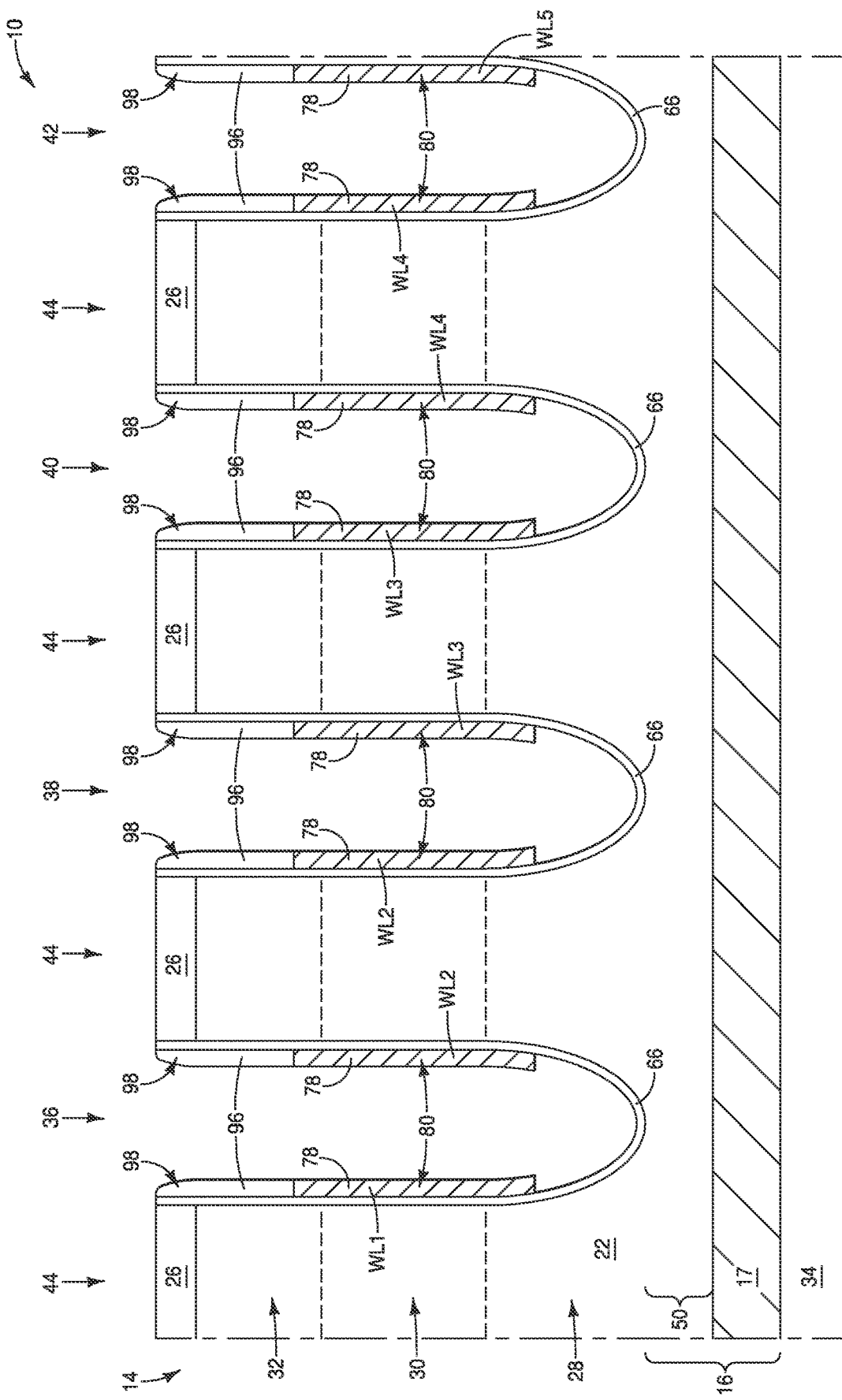

Referring to FIG. 31, the first material 68 (shown in FIG. 30) is removed from beneath the conductive lines 80. The conductive lines 80 of FIG. 31 comprise transistor gates along the channel regions 30, and are incorporated into the wordlines WL1-WL5. In subsequent processing, the construction 10 of FIG. 31 may be incorporated into a memory array of the type described above with reference to FIGS. 15 and 16. For instance, the upper source/drain regions 32 may be coupled with appropriate charge-storage devices analogous to the devices 82 described above with reference to FIG. 15. In some embodiments, air gaps may remain in lower regions of the trenches beneath the conductive lines 80 in memory arrays formed from the construction of FIG. 31. Such air gaps may advantageously correspond to low-permittivity (i.e., low-dielectric-constant) regions which may alleviate potential capacitive coupling between neighboring conductive structures.

In some embodiments, it may be advantageous to reduce a height of the second material 72 prior to forming the conductive material 78 within the gaps 74. Such may be particularly useful in applications in which the trenches have very high aspect ratios. An example embodiment in which the second material 72 is recessed into the trenches 36, 38, 40 and 42 prior to forming the conductive material 78 is described with reference to FIGS. 32-34.

Figure 32:
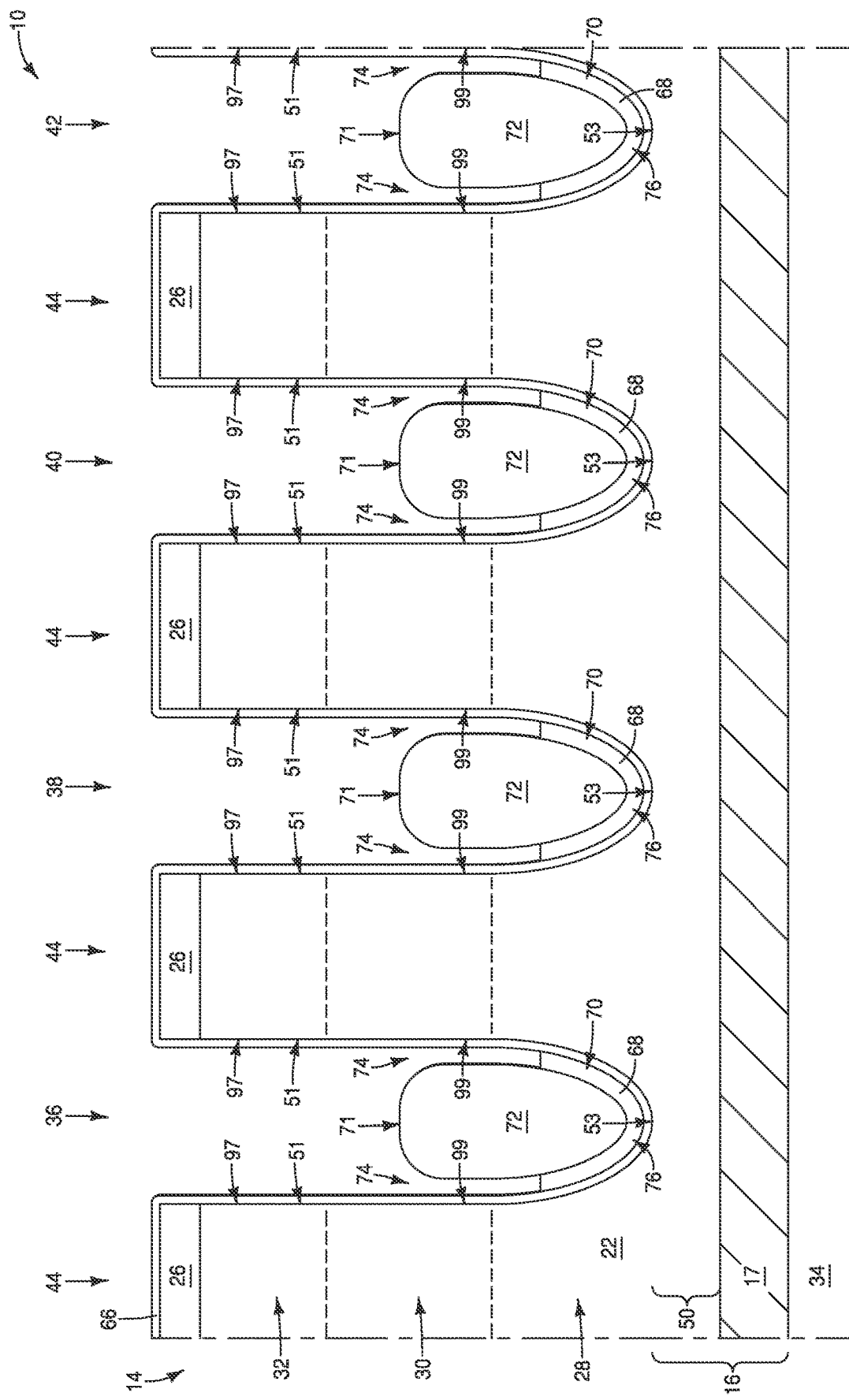
FIG. 32 is a diagrammatic cross-sectional side view of an example process stage that may follow the process stage of FIG. 11.

FIG. 32 shows the construction 10 at a process stage which may follow that of FIG. 11. The upper surfaces 71 of the second material 72 are recessed to a level beneath that shown in FIG. 11, and then portions of the first material 68 are removed to form the gaps 74. In some embodiments, the sidewall surfaces 51 may be considered to have first portions 97 above the gaps 74, and to have second portions 99 within the gaps.

Figure 33:
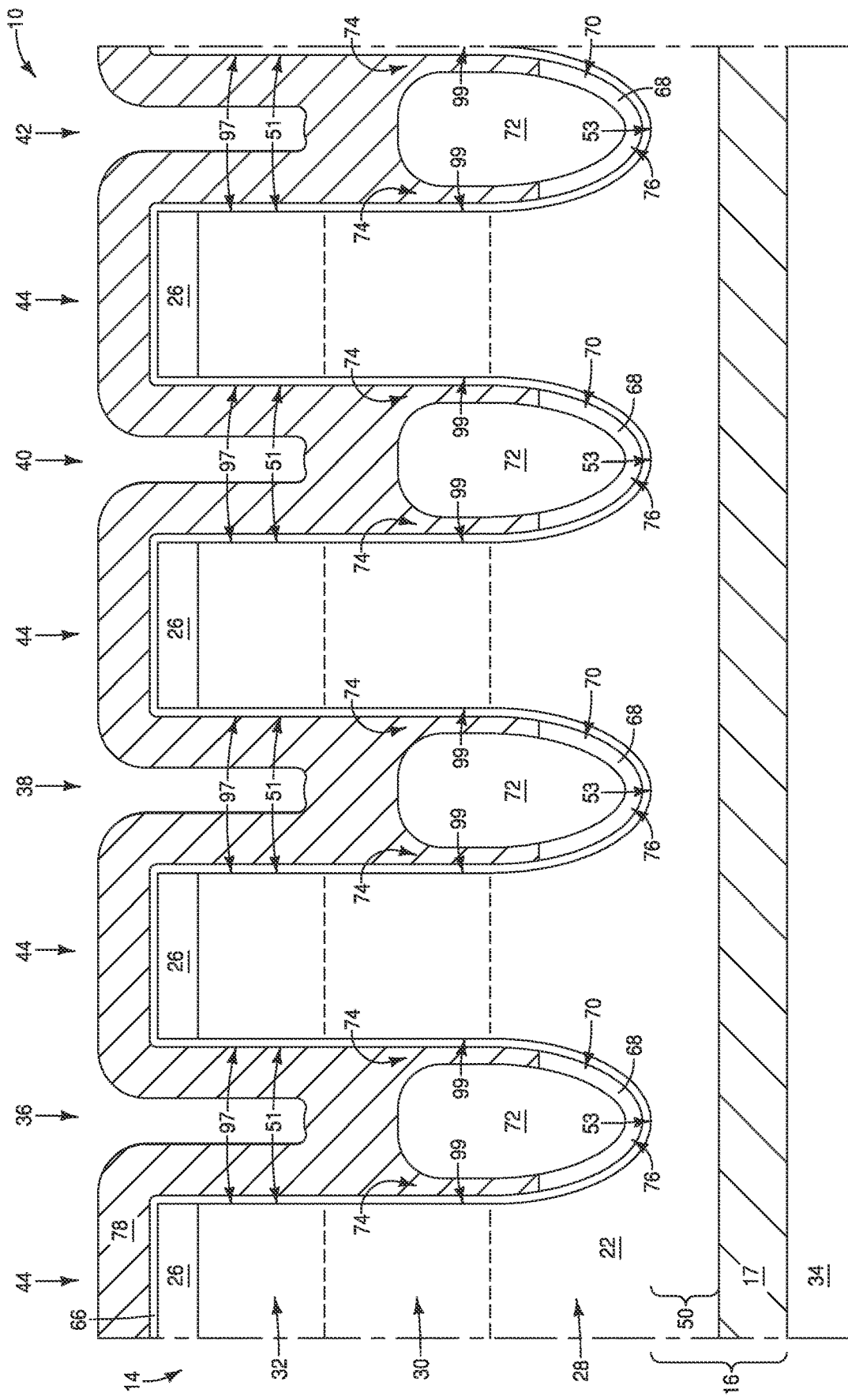
FIGS. 33 and 34 are diagrammatic cross-sectional side views of example process stages that may follow the process stage of FIG. 32.

Referring to FIG. 33, the construction 10 is shown at a processing stage following that of FIG. 32, and analogous to that of FIG. 13. The conductive material 78 is formed over the rails 44 and within the trenches 36, 38, 40 and 42. The conductive material 78 is entirely fills the gaps 74, and extends along the first portions 97 of the sidewall surfaces of the rails.

Figure 34:
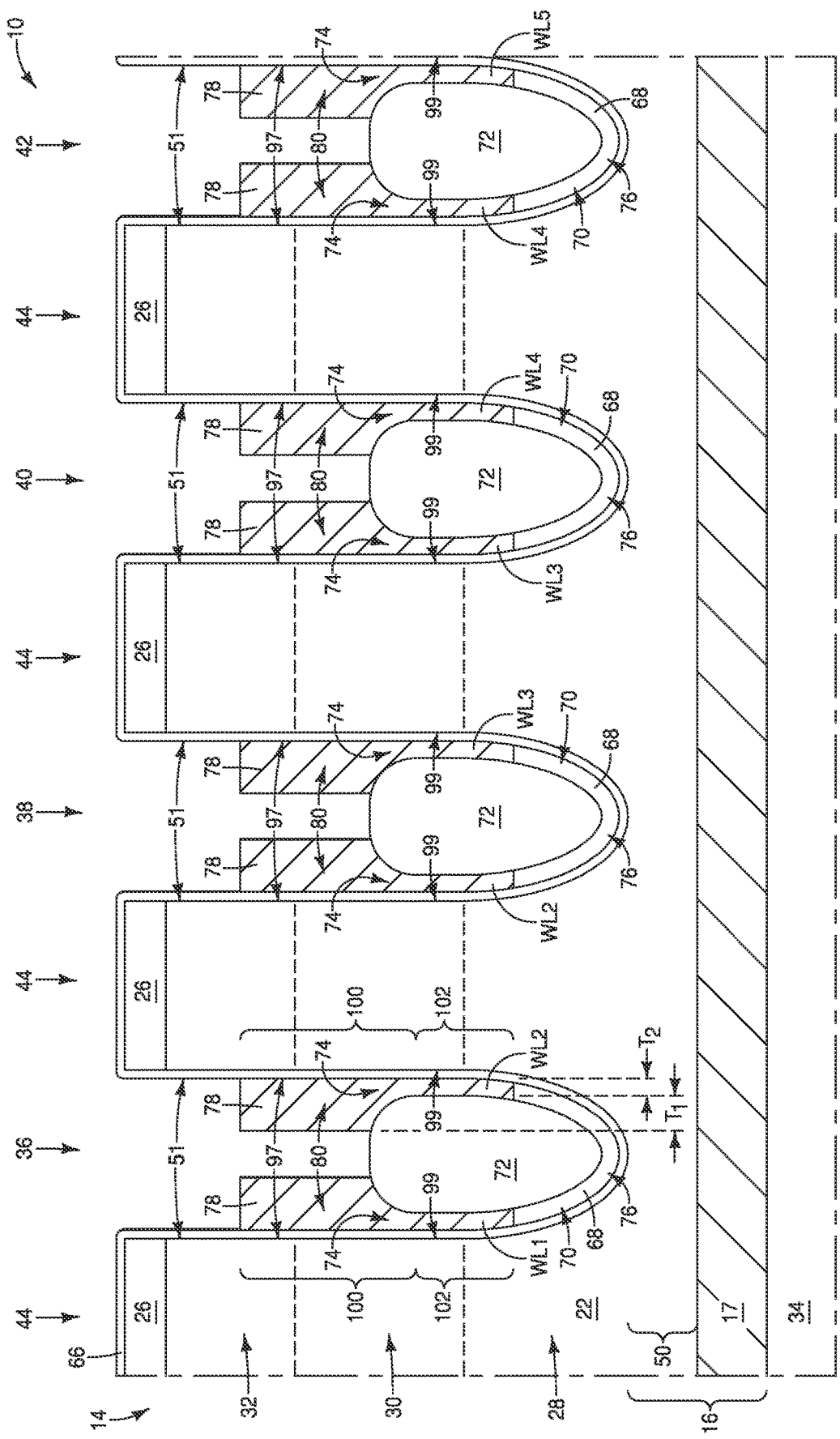

Referring to FIG. 34, construction 10 is shown at a processing stage subsequent to that of FIG. 33, and analogous to that of FIG. 14. The conductive material 78 is patterned into the conductive lines 80. In the illustrated embodiment, each of the conductive lines 80 includes a region 100 along the first portion 97 of a sidewall surface 51, and another region 102 along the second portion 99 of the sidewall surface 51. The regions 100 of the conductive lines 80 correspond to upper portions of such conductive lines, and may be considered to correspond to upper portions of the wordlines WL1-WL5. The regions 102 of the conductive lines 80 correspond to lower portions of such conductive lines, and may be considered to correspond to lower portions of the wordlines WL1-WL5. In the shown embodiment, the regions 100 have first thicknesses $T_1$, and the regions 102 have second thicknesses $T_2$; where the first thicknesses are greater than the second thicknesses (i.e., the upper portions of the wordlines WL1-WL5 are laterally thicker than the lower portions of such wordlines). In some embodiments, the thickness $T_1$ may be at least about 30% greater than the thickness $T_2$.

In some applications, the embodiment of FIGS. 33 and 34 may be considered to correspond to an embodiment in which the conductive material 78 is formed along segments of the rails 44 above the gaps 74 as well is being formed within the gaps, and is then patterned into wordlines WL1-WL5 which include regions of the conductive material 78 above the gaps 74, as well as regions of the conductive material within the gaps. In contrast, the embodiment of FIGS. 13 and 14 has the conductive material 78 formed along segments of the rails 44 above the gaps 74 as well is within the gaps, but then has the entirety of the conductive material removed from above the gaps so that the wordlines WL1-WL5 only comprise the conductive material 78 remaining within the gaps 74.

The embodiment of FIGS. 32-34 may be particularly useful for trenches have very high aspect ratios in which it may be challenging to form the long gaps 74 of FIG. 12.

The construction 10 of FIG. 34 may be incorporated into a memory array of the type described above with reference to FIGS. 15 and 16. For instance, the upper source/drain regions 32 may be coupled with appropriate charge-storage devices analogous to the devices 82 described above with reference to FIG. 15.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc. The etches described herein may utilize any suitable etch methodologies, including, for example, dry etches, wet etches, plasma etches, etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. A structure is provided to have spaced-apart conductive lines which extend along a first direction, and to have rails over the conductive lines and which extend along a second direction that crosses the first direction. Each of the rails includes pillars of semiconductor material spaced from one another by intervening regions of insulative material. The rails are laterally spaced from one another by intervening spaces. The rails have sidewall surfaces along the spaces. The pillars have upper segments, middle segments and lower segments. First-material liners are formed along the sidewall surfaces of the rails. A second material is formed over the liners. First sections of the liners are removed to form gaps between the second material and the sidewall surfaces of the rails. Second sections of the liners remain under the gaps. Conductive material is formed within the gaps. The conductive material is configured as conductive lines which extend along the second direction. The conductive lines are along the middle segments of the pillars.

Some embodiments include a method of forming an integrated assembly. A structure is provided to have first panels of semiconductor material and second panels of insulative material. The first and second panels extend along a first direction, and alternate with one another along a second direction which crosses the first direction. Trenches are formed to extend into the structure. The trenches extend along the second direction. The trenches form an upper portion of the structure into rails. The rails comprise pillars of the semiconductor material. Interior surfaces of the trenches include sidewall surfaces of the rails. The pillars have upper segments, middle segments and lower segments. A first material is provided to extend over the rails and along the interior surfaces of the trenches. The first material forms liners which extend along the sidewall surfaces of the rails. A second material is formed over the first material and within the trenches. A portion of the second material is removed selectively relative to the first material to recess an upper surface of the second material. First sections of the liners are removed to form gaps between the second material and the sidewall surfaces of the rails. Second sections of the liners remain under the gaps. Conductive material is formed within the gaps. The conductive material is configured as conductive lines extending along the second direction. The conductive lines comprise transistor gates along the middle segments of the pillars.

Some embodiments include a method of forming an integrated assembly. A structure is provided to have first panels of semiconductor material and second panels of insulative material. The first and second panels extend along a first direction, and alternate with one another along a second direction which crosses the first direction. The panels of semiconductor material are over conductive lines which extend along the first direction. Trenches are formed to extend into the structure. The trenches extend along the second direction. The trenches form an upper portion of the structure into rails. The rails comprise pillars of the semiconductor material. The pillars are spaced from one another by intervening insulative regions within the rails. Interior surfaces of the trenches include sidewall surfaces of the rails and bottom surfaces along spaces between the rails. Lower portions of the semiconductor material of the first panels remain under the rails and the trenches, and are configured as semiconductor-material lines passing under the trenches and the pillars. The semiconductor-material lines and the conductive lines together form digit lines which extend along the first direction. The pillars have upper segments, lower segments, and middle segments. The upper and lower segments comprise first and second source/drain regions, respectively, and the middle segments comprise channel regions. The lower source/drain regions are coupled with the digit lines. Liners of first material are formed. The liners extend over the rails and along the sidewall surfaces of the rails. A second material is formed over the rails and within the trenches. The second material is formed over the liners. A planarized surface is formed to extend across the first and second materials. An upper surface of the second material is recessed within the trenches. First sections of the liners are removed to form gaps between the second material and the sidewall surfaces of the rails. Second sections of the liners remain under the gaps. Conductive material is formed within the gaps. The conductive material is included within wordlines which extend along the second direction. The wordlines are along the channel regions of the pillars.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    forming a liner between a sidewall surface of a pillar of semiconductor material and material in a trench; the pillar having an upper segment comprising an upper source/drain region over a middle segment comprising a channel region over a lower segment comprising a lower source/drain region;
    removing a first portion of the liner creating a gap between the sidewall surface of the pillar and the material of the trench and leaving a second portion of the liner between the sidewall surface of the pillar and the material of the trench; and
    forming conductive material within the gaps along the middle segment of the pillar.

2. The method of claim 1 further comprising forming a insulative layer between the liner and the pillar of the semiconductor material.

3. The method of claim 2 further comprising leaving the insulative layer intact during the removing of the first portion of the liner.

4. The method of claim 2 wherein insulative layer comprises a gate dielectric.

5. The method of claim 2 further comprising forming a spacer structure in the trench against the insulative layer.

6. The method of claim 5 further comprising removing the material in the trench after the forming of the spacer structure.

7. The method of claim 1 wherein the forming of the liner is formed before the material in the trench.

8. The method of claim 1 further comprising recessing the material in the trench before the removing of the first portion of the liner.

9. The method of claim 1 wherein the semiconductor material is covered by a protective material.

10. The method of claim 2 further comprising replacing a portion of the insulative layer with a different insulative layer.

11. The method of claim 1 further comprising replacing a portion of the conductive material with a different conductive material.

12. The method of claim 11 wherein the different conductive material comprises a different workfunction relative to the portion of the conductive material replaced.

13. The method of claim 1 wherein the forming of the conductive material within the gap does not completely fill the gap.

14. The method of claim 1 further comprising removing the material in the trench after the forming of the conductive material.

15. The method of claim 1 further comprising forming protective material in the gap over the conductive material.

16. The method of claim 1 further comprising forming protective material over the pillar of the semiconductor material.

17. The method of claim 1 wherein the second portion of the liner lines a bottom portion of the trench, and further comprising removing the second portion of the liner that lines the bottom portion of the trench after the removing of the material in the trench.

18. A method of forming an integrated assembly, comprising:
    forming a liner between a sidewall surface of a pillar of semiconductor material and material in a trench; the pillar having an upper segment, a middle segment and a lower segment defining the sidewall surface;
    removing a first portion of the liner creating a gap between the sidewall surface of the pillar and the material of the trench and leaving a second portion of the liner between the sidewall surface of the pillar and the material of the trench; and
    forming conductive material within the gaps along the middle segment of the pillar, wherein the semiconductor material is covered by a protective material.

19. A method of forming an integrated assembly, comprising:
    forming a liner between a sidewall surface of a pillar of semiconductor material and material in a trench; the pillar having an upper segment, a middle segment and a lower segment defining the sidewall surface;
    removing a first portion of the liner creating a gap between the sidewall surface of the pillar and the material of the trench and leaving a second portion of the liner between the sidewall surface of the pillar and the material of the trench;
    forming conductive material within the gaps along the middle segment of the pillar;
    forming a insulative layer between the liner and the pillar of the semiconductor material; and
    replacing a portion of the insulative layer with a different insulative layer.

20. A method of forming an integrated assembly, comprising:
    forming a liner between a sidewall surface of a pillar of semiconductor material and material in a trench; the pillar having an upper segment, a middle segment and a lower segment defining the sidewall surface;
    removing a first portion of the liner creating a gap between the sidewall surface of the pillar and the material of the trench and leaving a second portion of the liner between the sidewall surface of the pillar and the material of the trench;
    forming conductive material within the gaps along the middle segment of the pillar; and
    replacing a portion of the conductive material with a different conductive material.

21. The method of claim 20 wherein the different conductive material comprises a different workfunction relative to the portion of the conductive material replaced.

22. A method of forming an integrated assembly, comprising:
    forming a liner between a sidewall surface of a pillar of semiconductor material and material in a trench; the pillar having an upper segment, a middle segment and a lower segment defining the sidewall surface;
    removing a first portion of the liner creating a gap between the sidewall surface of the pillar and the material of the trench and leaving a second portion of the liner between the sidewall surface of the pillar and the material of the trench;
    forming conductive material within the gaps along the middle segment of the pillar, wherein the forming of the conductive material within the gap does not completely fill the gap.

23. A method of forming an integrated assembly, comprising:
    forming a liner between a sidewall surface of a pillar of semiconductor material and material in a trench; the pillar having an upper segment, a middle segment and a lower segment defining the sidewall surface;
    removing a first portion of the liner creating a gap between the sidewall surface of the pillar and the material of the trench and leaving a second portion of the liner between the sidewall surface of the pillar and the material of the trench;
    forming conductive material within the gaps along the middle segment of the pillar; and
    removing the material in the trench after the forming of the conductive material.

24. A method of forming an integrated assembly, comprising:
    forming a liner between a sidewall surface of a pillar of semiconductor material and material in a trench; the pillar having an upper segment, a middle segment and a lower segment defining the sidewall surface;
    removing a first portion of the liner creating a gap between the sidewall surface of the pillar and the material of the trench and leaving a second portion of the liner between the sidewall surface of the pillar and the material of the trench;
    forming conductive material within the gaps along the middle segment of the pillar; and
    forming protective material in the gap over the conductive material.

25. A method of forming an integrated assembly, comprising:
    forming a liner between a sidewall surface of a pillar of semiconductor material and material in a trench; the pillar having an upper segment, a middle segment and a lower segment defining the sidewall surface;
    removing a first portion of the liner creating a gap between the sidewall surface of the pillar and the material of the trench and leaving a second portion of the liner between the sidewall surface of the pillar and the material of the trench;

forming conductive material within the gaps along the middle segment of the pillar;

forming a insulative layer between the liner and the pillar of the semiconductor material; and forming a spacer structure in the trench against the insulative layer.

26. The method of claim 25 further comprising removing the material in the trench after the forming of the spacer structure.

27. A method of forming an integrated assembly, comprising:

forming a liner between a sidewall surface of a pillar of semiconductor material and material in a trench; the pillar having an upper segment, a middle segment and a lower segment defining the sidewall surface;

removing a first portion of the liner creating a gap between the sidewall surface of the pillar and the material of the trench and leaving a second portion of the liner between the sidewall surface of the pillar and the material of the trench;

forming conductive material within the gaps along the middle segment of the pillar; and forming protective material over the pillar of the semiconductor material.

28. A method of forming an integrated assembly, comprising:

forming a liner between a sidewall surface of a pillar of semiconductor material and material in a trench; the pillar having an upper segment, a middle segment and a lower segment defining the sidewall surface;

removing a first portion of the liner creating a gap between the sidewall surface of the pillar and the material of the trench and leaving a second portion of the liner between the sidewall surface of the pillar and the material of the trench;

forming conductive material within the gaps along the middle segment of the pillar; and wherein the second portion of the liner lines a bottom portion of the trench, and further comprising removing the second portion of the liner that lines the bottom portion of the trench after the removing of the material in the trench.

* * * * *